(12) United States Patent
Nagami

(10) Patent No.: US 9,761,419 B2
(45) Date of Patent: Sep. 12, 2017

(54) METHOD FOR CONTROLLING POTENTIAL OF SUSCEPTOR OF PLASMA PROCESSING APPARATUS

(71) Applicant: TOKYO ELECTRON LIMITED, Tokyo (JP)

(72) Inventor: Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/008,855

(22) Filed: Jan. 28, 2016

(65) Prior Publication Data
US 2016/0240353 A1 Aug. 18, 2016

(30) Foreign Application Priority Data
Feb. 16, 2015 (JP) ................... 2015-027433

(51) Int. Cl.
H01J 37/32 (2006.01)
(52) U.S. Cl.
CPC .. *H01J 37/32715* (2013.01); *H01J 37/32568* (2013.01); *H01J 37/32577* (2013.01)
(58) Field of Classification Search
CPC .............. H01J 37/32091; H01J 37/32715
See application file for complete search history.

(56) References Cited

U.S. PATENT DOCUMENTS

| | | | | |
|---|---|---|---|---|
| 4,959,516 A | * | 9/1990 | Tighe ................. | B65D 81/3446 219/730 |
| 5,147,497 A | * | 9/1992 | Nozawa ............ | H01J 37/32935 156/345.22 |
| 5,272,417 A | * | 12/1993 | Ohmi ................ | H01J 37/32082 156/345.47 |
| 5,997,687 A | * | 12/1999 | Koshimizu ....... | H01J 37/32082 118/723 E |
| 6,219,219 B1 | * | 4/2001 | Hausmann .......... | H01L 21/6831 361/234 |
| 8,377,255 B2 | * | 2/2013 | Iwata ................ | H01J 37/32091 118/723 E |
| 2003/0064225 A1 | * | 4/2003 | Ohashi .................... | C23C 16/27 428/408 |
| 2003/0219989 A1 | * | 11/2003 | Terasaki ................ | H01J 37/321 438/725 |
| 2003/0224616 A1 | * | 12/2003 | Ogawa ..................... | C23C 8/36 438/762 |

(Continued)

FOREIGN PATENT DOCUMENTS

JP 2011-210958 A 10/2011

*Primary Examiner* — Bret Chen
(74) *Attorney, Agent, or Firm* — Rothwell, Figg, Ernst & Manbeck, P.C.

(57) ABSTRACT

In a method of suppressing abnormal discharge through a space between a space and a susceptor, a pulse-modulated high frequency wave is supplied from at least one of a first high frequency power supply and a second high frequency power supply. In addition, a DC voltage, which is pulse-modulated in synchronization with the modulated high frequency wave, is applied to the susceptor from a voltage application unit. A voltage value of the modulated DC voltage is set to reduce a difference between a potential of the substrate placed on an electrostatic chuck and a potential of the susceptor.

9 Claims, 17 Drawing Sheets

(56) References Cited

U.S. PATENT DOCUMENTS

| | | | |
|---|---|---|---|
| 2006/0037702 A1* | 2/2006 | Hayashi | H01J 37/32449 156/345.46 |
| 2006/0115600 A1* | 6/2006 | Muto | C23C 4/02 427/448 |
| 2006/0273733 A1* | 12/2006 | Honda | H01J 37/32568 315/111.21 |
| 2010/0025372 A1* | 2/2010 | Tsujimoto | H01J 37/32091 216/71 |
| 2012/0037597 A1* | 2/2012 | Koshimizu | H01J 37/32091 216/67 |
| 2014/0305905 A1* | 10/2014 | Yamada | H01J 37/32091 216/71 |
| 2015/0122420 A1* | 5/2015 | Konno | H01J 37/32165 156/345.28 |
| 2016/0079037 A1* | 3/2016 | Hirano | H01J 37/32146 156/345.28 |

* cited by examiner

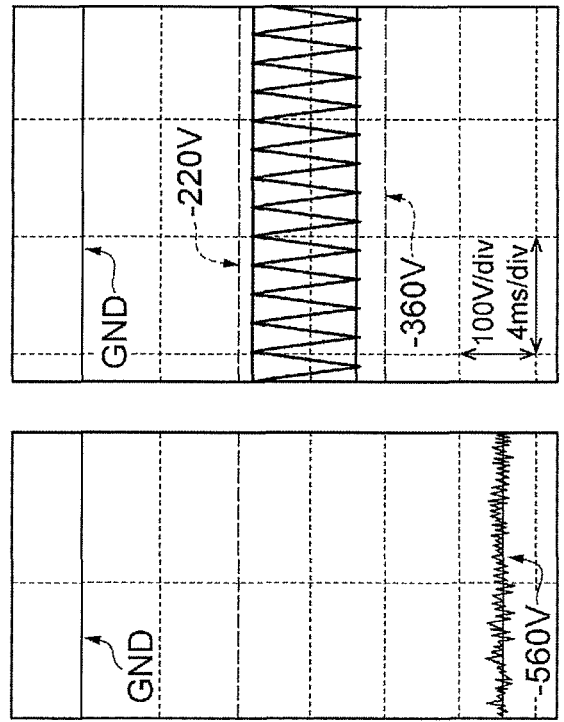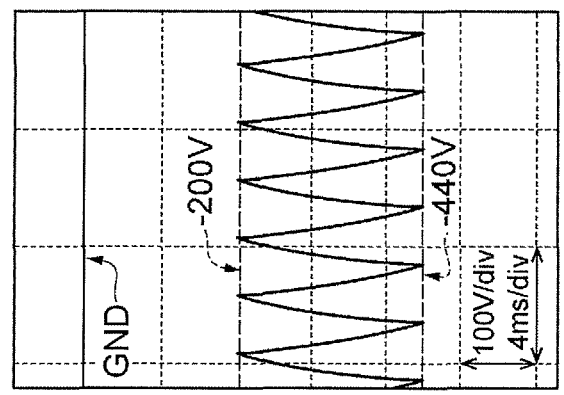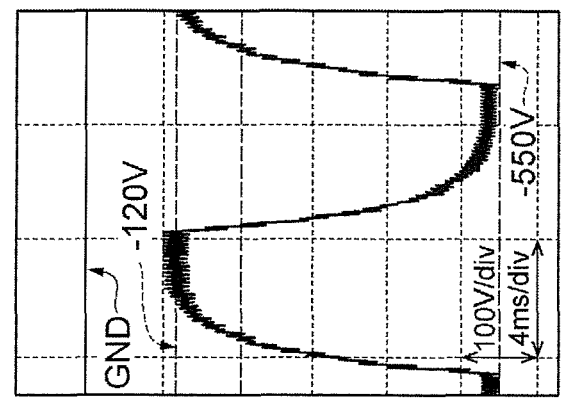

FIG.10

Table 1 (HF POWER (W) × LF POWER (W)):

| | $P_{LF}(1)$ | $P_{LF}(2)$ | $P_{LF}(3)$ | ... | $P_{LF}(M)$ |
|---|---|---|---|---|---|
| $P_{HF}(1)$ | $B_{DC}(1,1,1)$ | $B_{DC}(1,1,2)$ | $B_{DC}(1,1,3)$ | ... | $B_{DC}(1,1,M)$ |
| $P_{HF}(2)$ | $B_{DC}(1,2,1)$ | $B_{DC}(1,2,2)$ | $B_{DC}(1,2,3)$ | ... | $B_{DC}(1,2,M)$ |
| $P_{HF}(3)$ | $B_{DC}(1,3,1)$ | $B_{DC}(1,3,2)$ | $B_{DC}(1,3,3)$ | ... | $B_{DC}(1,3,M)$ |
| ... | ... | ... | ... | ... | ... |
| $P_{HF}(N)$ | $B_{DC}(1,N,1)$ | $B_{DC}(1,N,2)$ | $B_{DC}(1,N,3)$ | ... | $B_{DC}(1,N,M)$ |

Table 2:

| | $P_{LF}(1)$ | $P_{LF}(2)$ | $P_{LF}(3)$ | ... | $P_{LF}(M)$ |
|---|---|---|---|---|---|
| $P_{HF}(1)$ | $B_{DC}(2,1,1)$ | $B_{DC}(2,1,2)$ | $B_{DC}(2,1,3)$ | ... | $B_{DC}(2,1,M)$ |
| $P_{HF}(2)$ | $B_{DC}(2,2,1)$ | $B_{DC}(2,2,2)$ | $B_{DC}(2,2,3)$ | ... | $B_{DC}(2,2,M)$ |
| $P_{HF}(3)$ | $B_{DC}(2,3,1)$ | $B_{DC}(2,3,2)$ | $B_{DC}(2,3,3)$ | ... | $B_{DC}(2,3,M)$ |
| ... | ... | ... | ... | ... | ... |
| $P_{HF}(N)$ | $B_{DC}(2,N,1)$ | $B_{DC}(2,N,2)$ | $B_{DC}(2,N,3)$ | ... | $B_{DC}(2,N,M)$ |

DT

Table L:

| | $P_{LF}(1)$ | $P_{LF}(2)$ | $P_{LF}(3)$ | ... | $P_{LF}(M)$ |
|---|---|---|---|---|---|
| $P_{HF}(1)$ | $B_{DC}(L,1,1)$ | $B_{DC}(L,1,2)$ | $B_{DC}(L,1,3)$ | ... | $B_{DC}(L,1,M)$ |
| $P_{HF}(2)$ | $B_{DC}(L,2,1)$ | $B_{DC}(L,2,2)$ | $B_{DC}(L,2,3)$ | ... | $B_{DC}(L,2,M)$ |
| $P_{HF}(3)$ | $B_{DC}(L,3,1)$ | $B_{DC}(L,3,2)$ | $B_{DC}(L,3,3)$ | ... | $B_{DC}(L,3,M)$ |
| ... | ... | ... | ... | ... | ... |
| $P_{HF}(N)$ | $B_{DC}(L,N,1)$ | $B_{DC}(L,N,2)$ | $B_{DC}(L,N,3)$ | ... | $B_{DC}(L,N,M)$ |

METHOD FOR CONTROLLING POTENTIAL OF SUSCEPTOR OF PLASMA PROCESSING APPARATUS

CROSS-REFERENCE TO RELATED APPLICATIONS

This application is based on and claims priority from Japanese Patent Application No. 2015-027433, filed on Feb. 16, 2015, with the Japan Patent Office, the disclosure of which is incorporated herein in its entirety by reference.

TECHNICAL FIELD

The present disclosure relates to a method for controlling a potential of a susceptor of a plasma processing apparatus.

BACKGROUND

Various plasma processings such as, for example, dry etching, oxidation, and film formation, are performed on a substrate, in manufacturing various electronic devices that are so-called semiconductor devices. In such plasma processings, a plasma processing apparatus is used that generates plasma of a processing gas.

The plasma processing apparatus typically includes a processing container, a susceptor, an electrostatic chuck, first and second high frequency power supplies, and a gas supply unit. The processing container provides an internal space that can be evacuated. The gas supply unit supplies a processing gas to the space within the processing container. The susceptor and the electrostatic chuck are provided within the processing container.

The electrostatic chuck is provided on the susceptor. The electrostatic chuck is configured to attract and hold a substrate placed thereon. Specifically, the electrostatic chuck has an electrode in a dielectric film provided therein. The substrate is held on the electrostatic chuck by the electrostatic force that is generated when a positive polarity DC voltage is applied to the electrode.

In addition, through holes are formed in the susceptor and the electrostatic chuck to move lift pins upward and downward therethrough. The lift pins support the unprocessed substrate on tip ends thereof in a state in which the tip ends protrude to the upper side of the electrostatic chuck. Then, the lift pins move downward such that the substrate is placed on the electrostatic chuck. After the plasma processing of the substrate, the lift pins are moved upward such that the substrate is released from the electrostatic chuck.

A first flow path for a coolant is provided inside the susceptor in order to control the temperature of the substrate during the plasma processing. In addition, for example, a heater device to heat the substrate is provided in the electrostatic chuck. In order to effectively transfer the temperature of the susceptor to the substrate, a second flow path is formed in the susceptor and the electrostatic chuck so as to supply a backside gas for heat transfer (generally, He gas) to the gap between the rear surface of the substrate and the top surface of the electrostatic chuck.

In general, the susceptor also serves as a high frequency electrode, i.e., a lower electrode. A high frequency wave is supplied to the susceptor from the first and second high frequency power supplies through a matcher, during the plasma processing. The first high frequency power supply generates a first high frequency wave for plasma generation, and the second high frequency power supply generates a second high frequency wave for ion drawing-in. When performing the plasma processing, a processing gas is supplied from the gas supply unit into the processing container, and the high frequency waves are supplied from the first and second high frequency power supplies to the susceptor in the state in which the substrate is attracted on the electrostatic chuck, so that plasma of the processing gas is generated.

However, in the plasma processing apparatus, when a high-pressure positive polarity DC voltage is applied to the electrode within the electrostatic chuck, abnormal discharge may occur between the substrate and the susceptor, thereby damaging the substrate. Herein, this phenomenon will be specifically described with reference to FIG. 1. As illustrated in FIG. 1, in general, an electrostatic chuck ESC is provided on the susceptor LE via an adhesive AH. The substrate W is placed on the electrostatic chuck ESC, and a focus ring FR is provided around the substrate W and the electrostatic chuck ESC.

The substrate W is attracted onto the electrostatic chuck ESC by the electrostatic force that is generated when the positive polarity DC voltage is applied to the electrode CE of the electrostatic chuck ESC from a DC power supply DCP. In the state illustrated in FIG. 1, the electrostatic chuck ESC has a potential of a high positive polarity, for example, a potential of 1,000 V or more, as represented by ⌈+⌋ that is superimposed on the electrostatic chuck ESC in FIG. 1. In addition, it may be regarded that the susceptor LE is in a state of electrically floating with respect to the grounded processing container, and a capacitance (represented as the reference code CA in FIG. 1) exists between the susceptor LE and the processing container. Further, it may be regarded that a capacitance (represented as the reference symbol CB in FIG. 1) also exists between the susceptor LE and the electrode CE of the electrostatic chuck ESC. Accordingly, the susceptor LE has a potential of the same polarity as that of the electrostatic chuck ESC, i.e., the positive polarity, as represented by ⌈+⌋ that is superimposed on the susceptor LE in FIG. 1. When the high frequency waves from the first and the second frequency power supplies are applied to the susceptor for plasma generation, the substrate W is exposed to the plasma, and the potential of the substrate W falls to be equal to or lower than a negative polarity potential (e.g., −500 V), which is identical to self-bias, as represented by ⌈−⌋ that is superimposed on the substrate W in FIG. 1. As a result, a large potential difference occurs between the substrate W and the susceptor LE.

In addition, as described above, the second flow path for the backside gas and a space DS corresponding to the through holes for the lift pins are formed in the susceptor LE and the electrostatic chuck ESC. Since a gas may exist within the space DS, abnormal discharge (see arrow A in FIG. 1) may occur between the substrate W and the susceptor LE due to the potential difference as described above.

In order to suppress such abnormal discharge, Japanese Patent Laid-Open Publication No. 2011-210958 discloses a technology that provides a current limiting device between a focus ring having a potential substantially equal to that of a substrate and a susceptor to move charges between the susceptor and the focus ring through the current limiting device so as to make the potential of the susceptor and the potential of the substrate close to each other.

SUMMARY

An aspect of the present disclosure provides a method for controlling a potential of a susceptor of a plasma processing apparatus. The plasma processing apparatus used in this method includes a processing container, a susceptor, an electrostatic chuck, a first high frequency power supply, a second high frequency power supply, and a voltage application unit. The susceptor is formed of a conductor, and provided within the processing container. The electrostatic chuck is provided on the susceptor. The first high frequency power supply generates a first high frequency wave for ion attraction. The second high frequency power supply generates a second high frequency wave for plasma production. A DC power supply applies a positive polarity DC voltage to an electrode of the electrostatic chuck. The voltage application unit applies a voltage to the susceptor. This method includes (a) supplying a pulse-modulated high frequency wave from at least one of the first high frequency power supply and the second high frequency power supply to the susceptor (hereinafter, referred to as a "modulated high frequency wave supplying process"), and (b) applying a DC voltage, which is pulse-modulated in synchronization with the modulated high frequency wave, from the voltage application unit to the susceptor, the modulated DC voltage having a voltage value set to reduce a difference between the potential of the substrate placed on the electrostatic chuck and the potential of the susceptor (hereinafter, referred to as a "modulated DC voltage applying process").

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3D are views exemplifying results obtained by measuring the changes in the potential of a substrate with time.

FIG. 10 is a view illustrating an exemplary data table.

DETAILED DESCRIPTION

Figure 1:
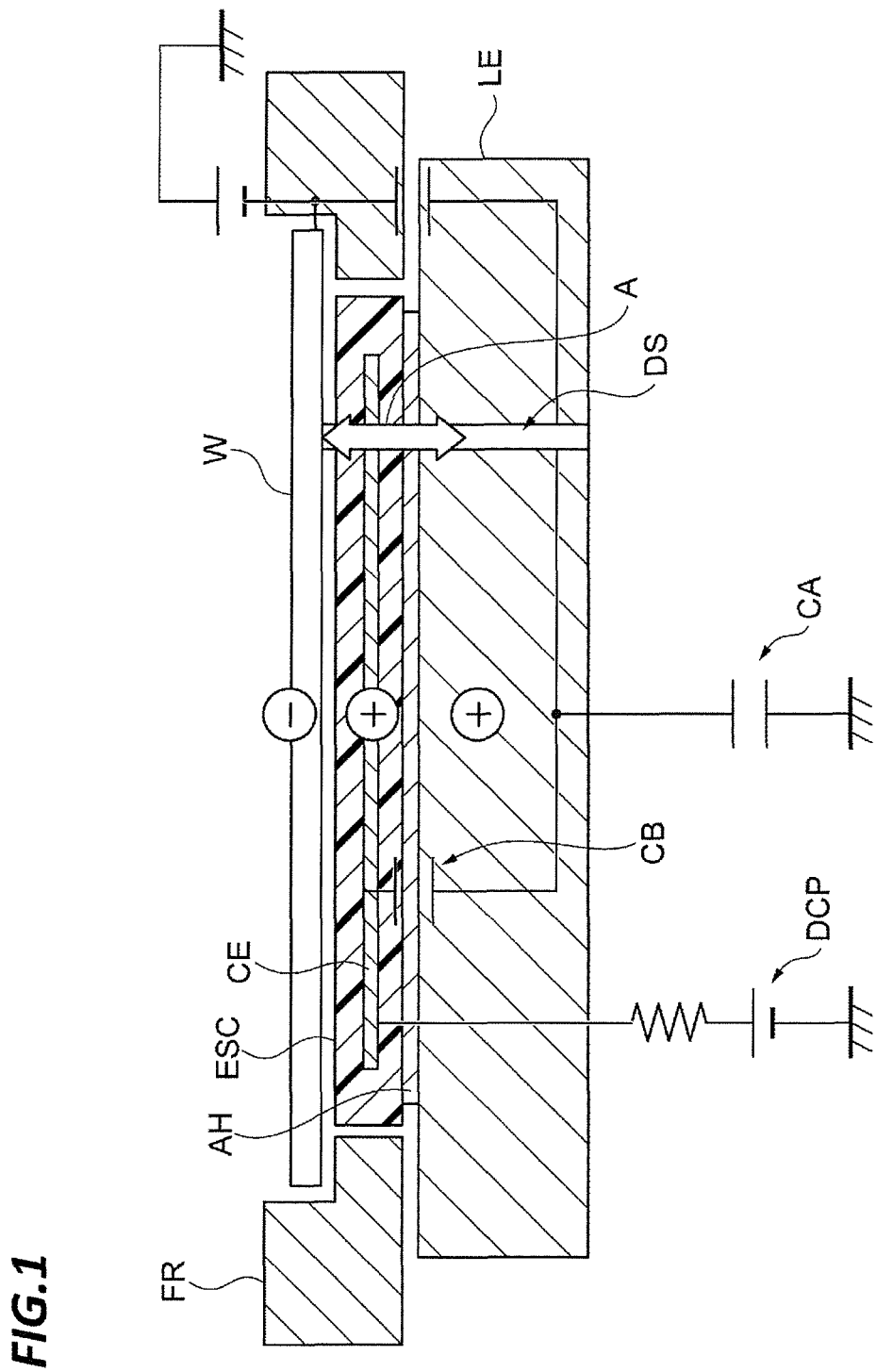
FIG. 1 is a view for describing a principle of occurrence of abnormal discharge between a susceptor and a substrate.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the plasma processing apparatus, in which the susceptor and the focus ring are electrically connected to each other by the current limiting device as described above, the focus ring is a consumable replacement part. Therefore, the current limiting device cannot be practically attached to the focus ring by, for example, welding or soldering and it is required to adopt a configuration, in which an electrical connection is obtained by contact such as, for example, spring biasing. However, in the electrical connection by contact, it is difficult to obtain a good electrical conduction between the focus ring and the current limiting device, and thus, a large potential difference easily occurs in a contact interface. For this reason, it is difficult to make the current limiting device exhibit the original function. Thus, the inventor of the present disclosure has developed a technology of suppressing the occurrence of the abnormal discharge by applying a voltage directly to the susceptor, thereby reducing a difference between the potential of the susceptor and the potential of the substrate.

However, in the plasma processing, a pulse-modulated high frequency wave may be supplied to the susceptor. That is, there is a case where a high frequency wave supplied to the susceptor is alternately turned ON/OFF. Accordingly, when the pulse-modulated high frequency wave is supplied to the susceptor, the potential of the substrate fluctuates. Thus, even when the pulse-modulated high frequency wave is used, it is required to suppress the occurrence of the abnormal discharge by applying a voltage directly to the susceptor so as to reduce a difference between the potential of the susceptor and the potential of the substrate.

An aspect of the present disclosure provides a method for controlling a potential of a susceptor of a plasma processing apparatus. The plasma processing apparatus used in this method includes a processing container, a susceptor, an electrostatic chuck, a first high frequency power supply, a second high frequency power supply, and a voltage application unit. The susceptor is formed of a conductor, and provided within the processing container. The electrostatic chuck is provided on the susceptor. The first high frequency power supply generates a first high frequency wave for ion attraction. The second high frequency power supply generates a second high frequency wave for plasma production. A DC power supply applies a positive polarity DC voltage to an electrode of the electrostatic chuck. The voltage application unit applies a voltage to the susceptor. The present method includes: (a) supplying a pulse-modulated high frequency wave from at least one of the first high frequency power supply and the second high frequency power supply to the susceptor (hereinafter, referred to as a "modulated high frequency wave supplying process"); and (b) applying a DC voltage, which is pulse-modulated in synchronization with the modulated high frequency wave, from the voltage application unit to the susceptor, the modulated DC voltage having a voltage value set to reduce a difference between the potential of the substrate placed on the electrostatic chuck and the potential of the susceptor (hereinafter, referred to as a "modulated DC voltage applying process").

In the method according to the aspect of the present disclosure, a DC voltage, which is modulated in synchronization with the pulse-modulated high frequency wave, i.e., the modulated high frequency wave, and has a voltage value to reduce a difference between the potential of the substrate and the potential of the susceptor, i.e., the modulated DC voltage, is applied to the susceptor. Accordingly, even when the modulated high frequency wave of at least one of the first high frequency wave and the second high frequency wave is used, the occurrence of the abnormal discharge may be suppressed by reducing the difference between the potential of the susceptor and the potential of the substrate.

In an exemplary embodiment, the voltage application unit receives a pulse signal, which is synchronized with the modulated high frequency wave, from the first high frequency power supply or the second high frequency power supply. The pulse signal is a pulse signal that has a first signal level in a first period when the modulated high frequency wave has a first power, and a second signal level in a second period when the modulated high frequency wave has a second power smaller than the first power. The voltage application unit applies a DC voltage, which is modulated in synchronization with the pulse signal, to the susceptor.

In an exemplary embodiment, in the modulated high frequency wave supplying process the first high frequency wave is pulse-modulated, and the modulated high frequency wave is supplied to the susceptor. In the modulated DC voltage applying process of the present exemplary embodiment, the voltage application unit applies the DC voltage to the susceptor in the first period, without applying the DC voltage to the susceptor in the second period. That is, in the present exemplary embodiment, a modulated high frequency voltage is generated by an ON/OFF control of the DC voltage, which is synchronized with the pulse modulation of the first high frequency wave, and applied to the susceptor.

In an exemplary embodiment, the voltage application unit may apply a DC voltage having a voltage value, of which an absolute value becomes large with increase of voltage amplitude on a transmission line, through which the modulated high frequency wave is supplied to the susceptor, to the susceptor in the first period. The voltage amplitude on the transmission line increases as an absolute value of the potential of the substrate by self-bias increases. In the present exemplary embodiment, the voltage value of the modulated DC voltage that is capable of suppressing the difference in a potential between the substrate and the susceptor is determined based on the voltage amplitude.

In an exemplary embodiment, the voltage application unit may apply a DC voltage having a voltage value in a data table, which is associated with the power of the first high frequency wave, the power of the second high frequency wave, and the modulated frequency of the modulated frequency wave, to the susceptor in the first period. In the present exemplary embodiment, the voltage value of the voltage to be applied to the susceptor is prepared in advance as a record of a data table in association with parameters affecting the potential of the substrate. The voltage value of the DC voltage to be applied to the susceptor is determined by using the data table.

In an exemplary embodiment, the voltage application unit may apply a DC voltage according to a measurement value of a self-bias potential of the substrate to the susceptor in the first period.

In an exemplary embodiment, in the modulated high frequency wave supplying process, the second high frequency wave is pulse-modulated, and the modulated high frequency wave is supplied to the susceptor. In the present exemplary embodiment, in the modulated DC voltage applying process, the voltage application unit may apply a first DC voltage having a first voltage value to the susceptor in the first period, and a second DC voltage having a second voltage value, of which an absolute value is larger than an absolute value of the first voltage value, to the susceptor in the second period. For example, when the pulse-modulated second high frequency wave is applied to the susceptor in a state in which the first high frequency wave is supplied to the susceptor, the absolute value of the potential of the substrate becomes relatively small in the first period when the second high frequency wave is applied to the susceptor. Meanwhile, the absolute value of the potential of the substrate becomes relatively larger in the second period when the second high frequency wave is not applied to the susceptor. Accordingly, the first DC voltage having the first voltage value is applied to the susceptor in the first period, and the second DC voltage having the second voltage value is applied to the susceptor in the second period, so that abnormal discharge may be suppressed.

In an exemplary embodiment, the voltage application unit may apply a DC voltage having a voltage value, of which an absolute value becomes larger with increase of voltage amplitude on a transmission line, through which the modulated high frequency wave is supplied to the susceptor, to the susceptor in each of the first and second periods.

In an exemplary embodiment, the voltage application unit may apply a DC voltage having a voltage value in a data table, which is associated with the power of the first high frequency wave, the power of the second high frequency wave, and the modulated frequency of the modulated frequency wave, to the susceptor in each of the first and second periods.

In an exemplary embodiment, the voltage application unit may apply a DC voltage according to a measurement value of a self-bias potential of the substrate in each of the first and second periods.

As described above, even when the pulse-modulated high frequency wave is used, the occurrence of the abnormal discharge may be suppressed by applying a voltage directly to the susceptor so as to reduce the difference between the potential of the susceptor and the potential of the substrate.

Hereinafter, various exemplary embodiments will be described in detail with reference to the drawings. In addition, identical or corresponding parts in each of the drawings will be denoted by the same symbols.

Figure 2:
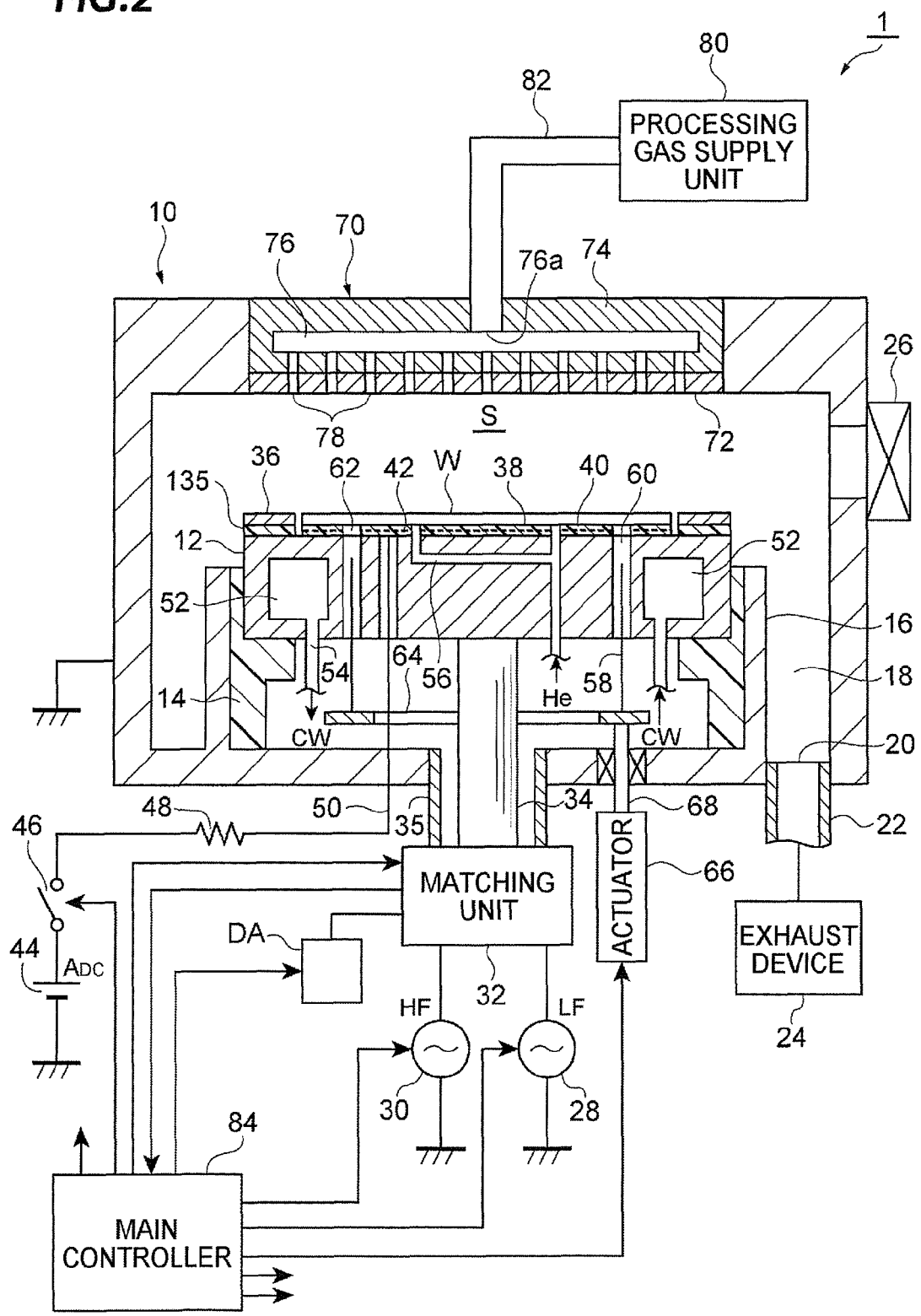
FIG. 2 is a view schematically illustrating a plasma processing apparatus according to an exemplary embodiment.

First, a plasma processing apparatus of an exemplary embodiment will be described. FIG. 2 is a view schematically illustrating a plasma processing apparatus according to an exemplary embodiment. The plasma processing apparatus 1 illustrated in FIG. 2 is configured as a lower dual frequency application type capacitively-coupled plasma processing apparatus. The plasma processing apparatus 1 includes a processing container 10. The processing container 10 has a generally cylindrical shape, and is formed of a metal such as, for example, aluminum or stainless steel. The processing container 10 is grounded.

A susceptor 12 is provided within the processing container 10. The susceptor 12 forms a high frequency electrode, i.e., a lower electrode. The susceptor 12 is formed of, for example, aluminum. The susceptor 12 is supported by a support unit 14. The support unit 14 has, for example, a cylindrical shape and extends upwardly from the bottom of the processing container 10. The support unit 14 is formed of an insulating material such as, for example, ceramic. Accordingly, the susceptor 12 is in a non-grounded state.

In addition, a support unit 16 extends upwardly along the outer periphery of the support unit 14 from the bottom of the processing container 10. The support unit 16 is conductive and may have a generally cylindrical shape. An exhaust path 18 is formed between the support unit 16 and the inner wall of the processing container 10. An exhaust port 20 provided by an exhaust pipe 22 is connected to the exhaust path 18. An exhaust device 24 is connected to the exhaust pipe 22. The exhaust device 24 has a vacuum pump, which is a so-called turbo molecular pump, and may depressurize the space within the processing container 10 to a desired vacuum level. In addition, a gate valve 26 is attached to the side wall of the processing container 10 so as to open/close a carry-in/out port of a substrate W.

A first high frequency power supply 28 and a second high frequency power supply 30 are electrically connected to the susceptor 12 via a matching unit 32 and a power feed rod 34. The first high frequency power supply 28 outputs a first high frequency wave LF of a frequency (e.g., 13.56 MHz), which mainly contributes to ion drawing-in with respect to the substrate W on the susceptor 12. Meanwhile, the second high frequency power supply 30 outputs a second high frequency wave HF of a frequency (e.g., 100 MHz), which mainly contributes to plasma generation.

The matching unit 32 mainly includes a matcher configured to take impedance matching between the first high frequency power supply 28 and the second high frequency power supply 30 and a load (usually plasma). The matcher will be described later. The power feed rod 34 is formed of a cylindrical or a columnar conductor. The upper end of the power feed rod 34 is connected to the central portion of the bottom surface of the susceptor 12, and the lower end of the power feed rod 34 is connected to a high frequency output terminal of the matcher within the matching unit 32. In addition, a cylindrical conductor cover 35 is provided between the bottom of the processing container 10 and the matching unit 32 to surround the power feed rod 34.

The susceptor 12 has a diameter or caliber, which is larger than that of the substrate W by one size. The top surface of the susceptor 12 is a generally horizontal surface, and includes a central area and a peripheral area. An electrostatic chuck 38 is provided on the central area. A focus ring 36 is provided on the peripheral area to surround the electrostatic chuck 38 and the substrate W. The focus ring 36 is provided on the peripheral area via the ring-shaped dielectric 135. The focus ring 36 is formed of any one of materials such as, for example, Si, SiC, C, and $SiO_2$, depending on the material of the surface of the substrate W (e.g., a material to be etched).

The electrostatic chuck 38 is provided on the central portion of the top surface of the susceptor 12. The electrostatic chuck 38 may be formed integrally with the susceptor 12 or coupled to the central area by, for example, an adhesive. The electrostatic chuck 38 has a dielectric layer 40 and an internal electrode 42. The internal electrode 42 is provided within the dielectric layer 40. A DC power supply provided outside the processing container 10 is electrically connected to the internal electrode 42 via a switch 46, a resistor 48, and a high voltage line 50. A high DC voltage ($A_{DC}$) (e.g., 2,000 V to 3,000 V) is applied at positive polarity from a DC power supply 44 to the internal electrode 42 of the electrostatic chuck 38 such that the substrate W is attracted to the electrostatic chuck 38 by the electrostatic force. In addition, the high voltage line 50 is a coated line, and penetrates the susceptor 12 from the bottom of the susceptor 12 to be connected to the internal electrode 42 of the electrostatic chuck 38.

A coolant flow path 52 is formed inside the susceptor 12. The coolant flow path 52 extends annularly or helically in the inside of the susceptor 12. A coolant having a predetermined temperature, for example, cooling water CW, is circularly supplied to the coolant flow path 52 from a chiller unit through a coolant supply pipe 54. The temperature of the susceptor 12 may be controlled by the temperature of the coolant to be supplied as described above. In addition, a gas flow path 56 is formed in the susceptor 12 and the electrostatic chuck 38. Backside gas such as, for example, He gas, is supplied to the gas flow path 56 from a backside gas supply unit through a gas supply pipe. The backside gas is supplied between the substrate W and the electrostatic chuck 38 through the gas flow path 56. Accordingly, the substrate W and the electrostatic chuck 38 are thermally coupled to each other.

The susceptor 12 and the electrostatic chuck 38A have a plurality of through holes that penetrate the susceptor 12 and the electrostatic chuck 38. A plurality of lift pins 58 (e.g., three lift pins) are inserted into the plurality of the through holes, respectively. FIG. 2 illustrates two through holes 60 and 62, into each of which one lift pin is inserted. The lift pins 58 are formed of an insulator such as, for example, resin or ceramics. The lift pins 58 are supported by a ring-shaped horizontal lift plate 64. The horizontal lift plate 64 is coupled to a lift driving shaft 68 of an actuator 66, which is configured by, for example, an air cylinder or a ball screw mechanism. The lift pins 58 support the substrate W at the tip ends thereof, in a state in which the tip ends protrude upward from the electrostatic chuck. Thereafter, the lift pins 58 are moved downward such that the substrate W is placed on the electrostatic chuck 38. After the plasma processing of the substrate W, the lift pins 58 are moved upward such that the substrate W is separated from the electrostatic chuck 38. That is, the lift pins 58 are used for loading and unloading the substrate W.

A shower head 70 is provided in the ceiling of the processing container 10. The shower head 70 is provided with a space being interposed between the shower head 70 and the susceptor 12. The shower head 70 also serves as an upper electrode. The shower head 70 has an electrode plate 72 and an electrode support 74. The electrode plate 72 is formed of, for example, Si, SiC, or C. The electrode plate 72 is in contact with the space S within the processing container 10. The space S between the electrode plate 72 and the susceptor 12 becomes a plasma generation space or a plasma processing space. The electrode support 74 supports the electrode plate 72 so as to be attachable to/detachable from the rear surface side (top side) of the electrode plate 72. The electrode support 74 is formed of, for example, alumite-processed aluminum. A gas chamber 76 is formed inside the electrode support 74. A plurality of gas ejection holes 78 are formed in the electrode support 74 and the electrode plate 72 to penetrate from the gas chamber 76 toward the susceptor 12 side. A gas inlet port 76a is provided in the top portion of the gas chamber 76. A processing gas supply unit 80 is connected to the gas inlet port 76a through a gas supply pipe 82.

The plasma processing apparatus 1 further includes a main controller 84. The main controller 84 includes a micro-computer and various types of interfaces and controls the operation of each of the components within the plasma processing apparatus 1, for example, the exhaust device 24, the first high frequency power supply 28, the second high frequency power supply 30, the matching unit 32, the switch 46, the actuator 66 of the lift mechanism, the chiller unit, the backside gas supply unit, and the processing gas supply unit 80, and the operation (sequence) of the entire apparatus, depending on software (program) and recipe information that are stored in an external memory or an internal memory.

In the present exemplary embodiment, the main controller 84 is illustrated as a single control unit. However, a plurality of control units may be adopted in the form of sharing the function of the main controller 84 in a parallel or hierarchical manner.

In the plasma processing apparatus 1, at least one of the first high frequency power supply 28 and the second high frequency power supply 30 generates a pulse-modulated high frequency wave, i.e., a modulated high frequency wave, and supplies the modulated high frequency wave to the susceptor 12.

The pulse modulation refers to a modulation that alternately turns ON/OFF at least one side of the first high frequency wave and the second high frequency wave to a frequency lower than the frequency of the first high frequency wave LF and the frequency of the second high frequency wave HF (hereinafter, referred to as a "modulated frequency"). In addition, the pulse modulation may be a modulation that alternately increases and decreases the power of the at least one high frequency wave. The modulated frequency of the pulse modulation is arbitrarily set depending on the purpose of the plasma processing. One cycle defined by the modulated frequency includes a period in which high frequency wave of the at least one side is turned ON (hereinafter, referred to as a "first period") and a period in which high frequency wave of the at least one side is turned OFF (hereinafter, referred to as a "second period"). The percentage (%) occupied by the first period in one cycle of the pulse modulation, i.e., the duty, is also arbitrarily set depending on the purpose of the plasma processing.

Herein, descriptions will be made on influences of existence/non-existence of the pulse modulation of the first high frequency wave LF and the modulated frequency of the pulse modulation of the first high frequency wave LF on the potential of the substrate W, with reference to FIGS. 3A to 3D. FIG. 3A represents a measurement result of fluctuation of the potential of the substrate W with time when the first high frequency wave LF (1,000 W) and the second high frequency wave HF (1,500 W) were continuously applied to the susceptor 12 without being pulse-modulated together. FIG. 3B represents a measurement result of fluctuation of the potential of the substrate W with time when the first high frequency wave LF (1,000 W), which was modulated to the modulated frequency of 1 kHz and the duty of 50%, i.e., the modulated frequency wave, was applied to the scepter 12, and the second high frequency wave HF (1,500 W) was continuously applied to the susceptor 12 without being pulse-modulated. FIG. 3C represents a measurement result of fluctuation of the potential of the substrate W with when the first high frequency wave LF (1,000 W), which was modulated to the modulated frequency of 0.5 kHz and the duty of 50%, i.e., the modulated frequency wave, was applied to the scepter 12, and the second high frequency wave HF (1,500 W) was continuously applied to the susceptor 12 without being pulse-modulated. FIG. 3D represents a measurement result of fluctuation of the potential of the substrate W with when the first high frequency wave LF (1,000 W), which was modulated to the modulated frequency of 0.1 kHz and the duty of 50%, i.e., the modulated frequency wave, was applied to the scepter 12, and the second high frequency wave HF (1,500 W) was continuously applied to the susceptor 12 without being pulse-modulated. All the fluctuations of the potential of the substrate W with time which are represented in FIGS. 3A to 3D were obtained by measuring the potentials of the substrate W, through a filter for eliminating the fluctuation of a potential, which has a frequency equal to or higher than the frequency of the first high frequency wave, with time. In addition, in FIGS. 3A to 3D, "GND" indicates a ground potential.

As illustrated in FIG. 3A, when both the first high frequency wave LF and the second high frequency wave HF are continuously applied to the susceptor 12, the potential of the substrate W becomes a substantially constant negative polarity potential. Accordingly, abnormal discharge through the space between the substrate W and the susceptor 12 such as, for example, the gas flow path 56, the through hole 60, and the through hole 62, is suppressed by applying a substantially constant negative polarity DC voltage to the susceptor 12.

Meanwhile, as illustrated in FIGS. 3B to 3D, when the pulse-modulated first high frequency wave LF, i.e., the modulated frequency wave, is applied to the susceptor 12, the potential of the substrate W fluctuates periodically. Especially, when the modulated frequency of the pulse modulation is lower than 1 kHz, the potential of the substrate W significantly fluctuates following the modulated high frequency wave. Accordingly, even when the constant negative polarity DC voltage, for example, a constant DC voltage, which is equal to the effective potential of the substrate W, is applied to the susceptor 12, abnormal discharge through the space between the substrate W and the susceptor 12 may occur. This phenomenon may occur not only when the second high frequency wave HF is pulse-modulated, but also when both the first high frequency wave LF and the second high frequency wave HF are pulse-modulated. Further, the phenomenon that the potential of the substrate W follows the modulated high frequency wave becomes remarkable when the frequency of the pulse modulation is below a predetermined frequency value. The verification obtained in the present exemplary embodiment indicates that the phenomenon as described above becomes remarkable when the frequency of the pulse modulation is below 1 kHz. The frequency of the pulse modulation at which the above-described phenomenon becomes remarkable depends on a stray capacitance of the plasma processing apparatus, i.e., a stray capacitance existing in a path through which the high frequency wave passes in plasma processing apparatus, and has a value that may be changed by the plasma processing apparatus.

The plasma processing apparatus 1 further includes a voltage application unit DA in order to suppress the abnormal discharge through the space between the substrate W and the susceptor 12, even when the potential of the substrate W fluctuates by applying the modulated high frequency wave to the susceptor 12 as described above. The voltage application unit DA is configured to apply a DC voltage, which is pulse-modulated in synchronization with the modulated high frequency wave, i.e., the modulated DC voltage, to the susceptor 12. In addition, the voltage value of the modulated DC voltage is set to reduce the difference between the potential (negative polarity potential) of the substrate W by self-bias and the potential (positive polarity potential) of the susceptor 12. In the plasma processing apparatus 1, the voltage application unit DA may also be controlled by the main controller 84.

Figure 4:
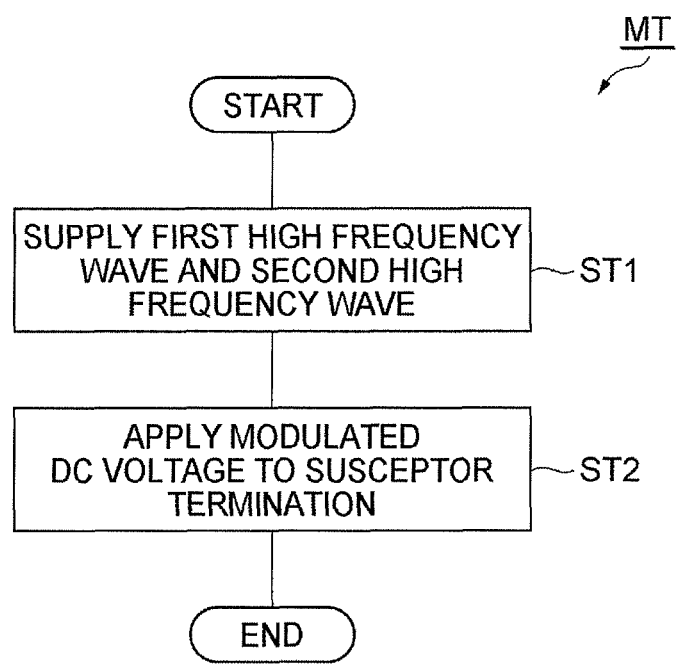
FIG. 4 is a flowchart illustrating a method for controlling a potential of a susceptor of the plasma processing apparatus according to an exemplary embodiment.

Hereinafter, descriptions will be made on the operation of the plasma processing apparatus 1 when performing the plasma processing, and a method for controlling the potential of the susceptor of the plasma processing apparatus according to an exemplary embodiment, with reference to FIG. 4 together with FIG. 2. FIG. 4 is a flowchart illustrating a method for controlling the potential of the susceptor of the plasma processing apparatus 1 according to an exemplary embodiment.

In the plasma processing of a substrate W in the plasma processing apparatus 1, a gate valve 26 is first opened and the substrate W is carried into the processing container 10 from a load lock chamber or a transfer chamber of the next room by a transfer arm.

Subsequently, a loading operation is performed. In the loading operation, the actuator 66 operates to move the lift pins 58 upward. The lift pins 58 receive the substrate W from the transfer arm. Subsequently, the lift pins 58 are moved downward, and the substrate W is placed on the electrostatic chuck 38.

Subsequently, a processing gas (generally a mixed gas) is introduced into the processing container 10 from the processing gas supply unit 80 at a predetermined flow rate. In addition, the pressure within the processing container 10 is adjusted by the exhaust device 24. The first high frequency wave LF is output from the first high frequency power supply 28, and the second high frequency wave HF is output from the second high frequency power supply 30. The first high frequency wave LF and the second high frequency wave HF are supplied to the susceptor 12 through the matching unit 32 and the power feed rod 34. The switch 46 is switched into the ON state such that the substrate W is held on the electrostatic chuck 38 by the electrostatic force. Then, a backside gas for heat transfer is supplied to the space between the substrate W and the susceptor from the backside gas supply unit. The processing gas supplied into the space S from the shower head 70 is excited by high frequency discharge, so that plasma is generated. A plasma processing such as, for example, etching, is performed on the substrate W by radicals or ions that are supplied from the generated plasma as described above.

In the plasma processing apparatus 1, at least one of the first high frequency wave LF and the second high frequency wave HF is supplied as the pulse-modulated high frequency wave, i.e., the modulated high frequency wave, to the susceptor 12 (step ST1 of FIG. 4). Further, a DC voltage, which is pulse-modulated in synchronization with the modulated high frequency wave, is supplied to the susceptor 12 by the voltage application unit DA (step ST2 of FIG. 4). The modulated DC voltage is a DC voltage having a voltage value, which is set to reduce the difference between the potential (negative polarity potential) of the substrate W by self-bias and the potential (positive polarity potential) of the susceptor 12. Accordingly, the difference in potential between the substrate W and the susceptor 12 is reduced, so that the occurrence of the abnormal discharge through the space between the substrate W and the susceptor 12, e.g., the gas flow path 56, the through hole 60, and the through hole 62, is suppressed. Therefore, the occurrence of damage to the substrate W resulting from the abnormal discharge is suppressed, so that the yield of the plasmas processing is improved.

Hereinafter, descriptions will be made on various matching units and voltage application units, which may be used as the matching unit 32 and the voltage application unit DA of the plasma processing apparatus 1. Further, descriptions will also be made on various examples of the pulse modulation of the first high frequency wave LF and the second high frequency wave HF, and various examples concerning the application of the modulated DC voltage, which is synchronized with the modulated high frequency wave.

First Example of Matching Unit and Voltage Application Unit

Figure 5:
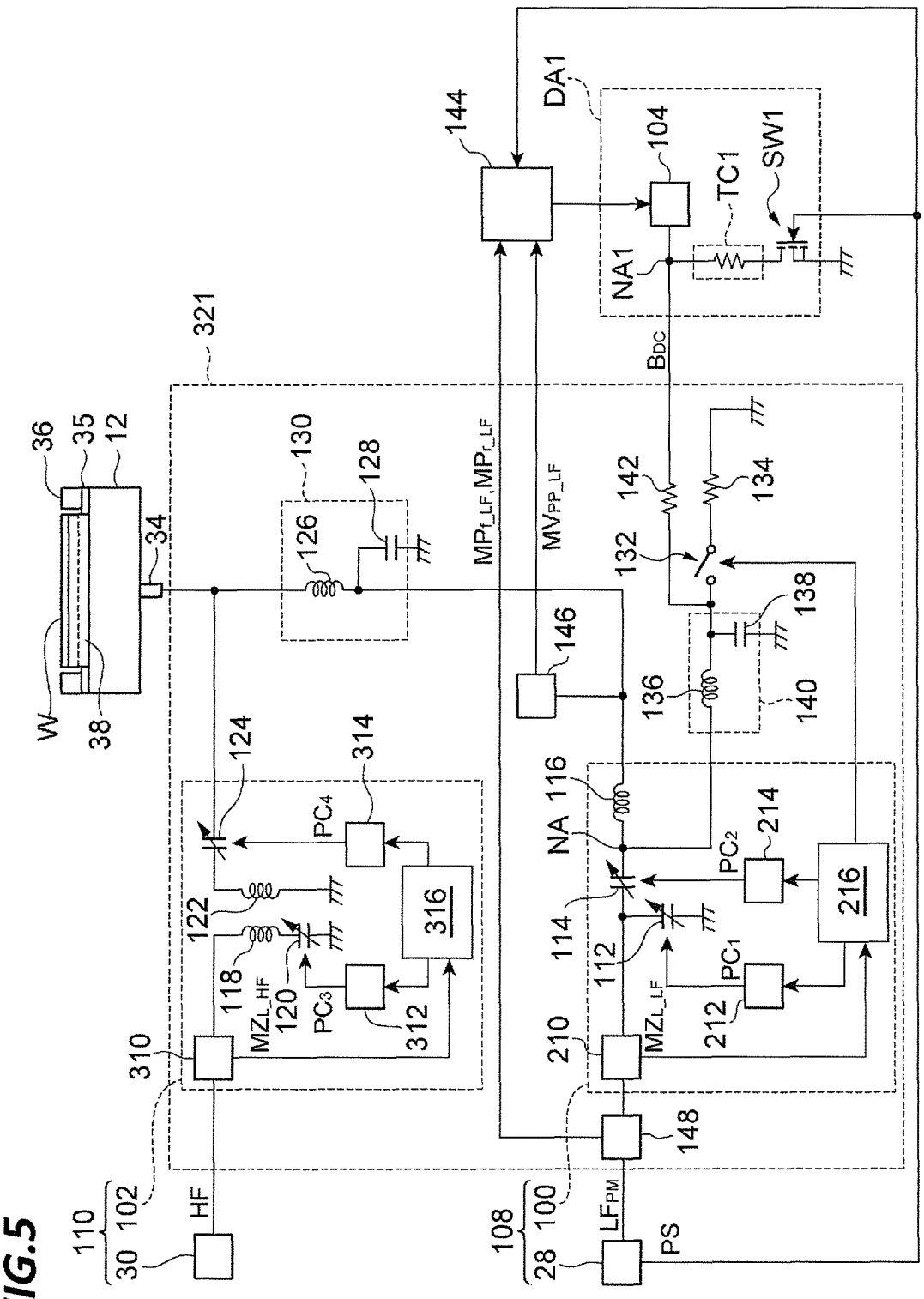
FIG. 5 is a view illustrating a first exemplary circuit configuration of a matching unit and a voltage application unit.
Figure 6:
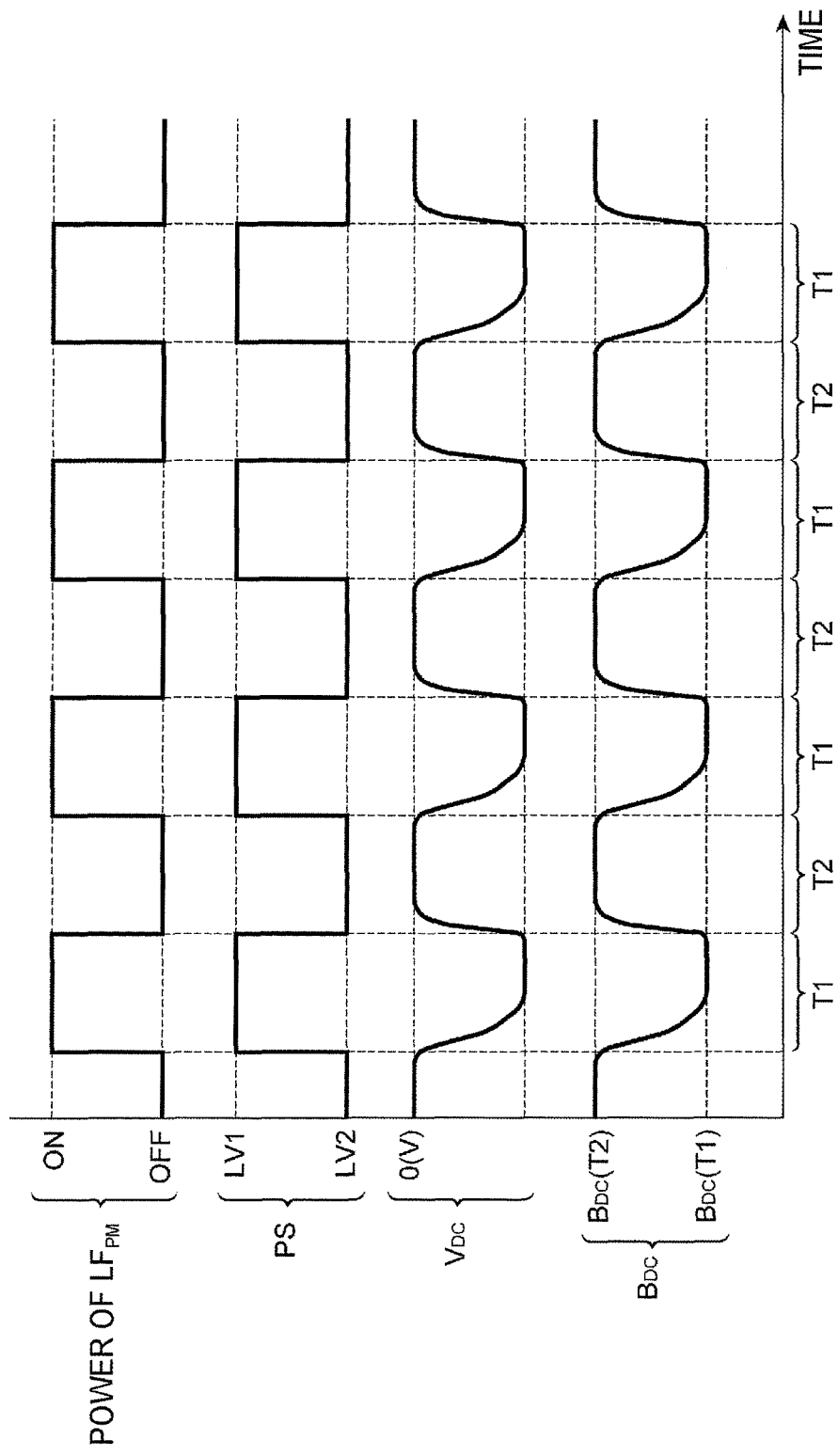
FIG. 6 is a view exemplifying a timing chart of a modulated high frequency wave, a pulse signal, a potential of a substrate, and a modulated DC voltage of a voltage application unit.

FIG. 5 is a view illustrating a first exemplary circuit configuration of the matching unit and the voltage application unit. FIG. 6 is a view exemplifying a timing chart of the power of the modulated high frequency wave $LF_{PM}$, the pulse signal output by the first high frequency power supply 28, the potential $V_{DC}$ (0 V or less) of the substrate, and the modulated DC voltage $B_{DC}$ of the voltage application unit. The first exemplary circuit configuration illustrated in FIG. 5 is to control the voltage value of the modulated high frequency voltage depending on a voltage amplitude $V_{PP\_LF}$ (peak-to-peak) of the first high frequency wave LF. Here, the voltage amplitude $V_{PP\_LF}$ of the first high frequency wave LF is a difference between the maximum peak value and the minimum peak value of the voltage of the first high frequency wave LF. The first exemplary circuit configuration may be used when the voltage amplitude of the second high frequency wave HF is negligibly small in the susceptor 12. In the first exemplary circuit configuration, only the first high frequency wave LF may be pulse-modulated, or both the first high frequency wave LF and the second high frequency wave HF may be pulse-modulated. Hereinafter, the first exemplary circuit configuration will be described with reference to a case where only the first high frequency wave LF is pulse-modulated, as an example.

The first exemplary circuit configuration includes a matching unit 321 and a voltage application unit DA1. The matching unit 321 is used as the matching unit 32 of FIG. 2, and the voltage application unit DA1 is used as the voltage application unit DA of FIG. 2. The matching unit 321 has a first matcher 100 and a second matcher 102. The first matcher 100 operates to effectively transmit the first high frequency wave LF output from the first high frequency power supply 28 to the plasma load within the processing container 10 in a non-reflective or less reflective manner. The first matcher 100 and the first high frequency power supply 28 form a first high frequency power feed unit 108. The second matcher 102 operates to effectively transmit the second high frequency wave HF output from the second high frequency power supply 30 to the plasma load within the processing container 10 in a non-reflective or less reflective manner. The second matcher 102 and the second high frequency power supply 30 form a second high frequency power feed unit 110.

The first matcher 100 includes a variable capacitance condenser 112, a variable capacitance condenser 114, and an inductor 116. The condenser 114 and the inductor 116 are connected in series between the output terminal of the first high frequency power supply 28 and a load. The condenser 112 is connected between the input-side terminal of the condenser 114 and a ground potential member. The condensers 112 and 114 and the inductor 116 form an L-shaped matching circuit.

The first matcher 100 further includes an auto-matching mechanism. In an exemplary embodiment, the auto-matching mechanism includes a motor 212 and a motor 214, which are so-called step motors, and a matching controller 216. The first matcher 100 further includes an impedance sensor 210. The impedance sensor 210 measures a load side impedance, which is seen at the first high frequency power supply 28 side, i.e., a load impedance $Z_{L\_LH}$ when the first high frequency power supply 28 outputs the first high frequency wave LF, and outputs a measurement value $MZ_{L\_LH}$ of the load impedance $Z_{L\_LH}$. The load impedance $Z_{L\_LH}$ refers to an impedance, in which the impedance of the load (generally, plasma) within the processing container 10 and the impedance of the L-shaped matching circuit of the first matcher 100 are combined with each other.

The matching controller 216 includes a micro-computer, and controls the positions $PC_1$ and $PC_2$ (variable condenser step) of the condenser 112 and the condenser 114 through a rotation control of the motor 212 and the motor 214 such that the measurement value $MZ_{L\_LH}$ output from the impedance sensor 210 becomes identical or closer to a matching point (in general, 50Ω) that is equivalent to the output impedance of the first high frequency power supply 28.

The second matcher 102 includes a coil 118 and a variable capacitance condenser 120 at the primary side, and a coil 122 and a variable capacitance condenser 124 at the secondary side. The coil 118 and the condenser 120 are connected in series between the output terminal of the second high frequency power supply 30 and a ground potential member. The coil 118 is transformer-coupled to the coil 122. The condenser 124 is connected in series between the coil 122 and the load. The coil 118, the condenser 120, the coil 122, and the condenser 124 form an inductively coupled matching circuit.

In addition, the second matcher 102 further includes an auto-matching mechanism. In an exemplary embodiment, the auto-matching mechanism includes a motor 312 and a motor 314, which are so-called step motors, and a matching controller 316. Also, the second matcher 102 further includes an impedance sensor 310. The impedance sensor 310 measures a load side impedance, which is seen at the second high frequency power supply 30 side, i.e., a load impedance $Z_{L\_HF}$ when the second high frequency power supply 30 outputs the second high frequency wave HF, and outputs a measurement value $MZ_{L\_HF}$ of the load impedance $Z_{L\_LF}$. The load impedance $Z_{L\_LF}$ refers to an impedance, in which the impedance of the load (generally, plasma) within the processing container 10 and the impedance of the inductively coupled matching circuit of the second matcher 102 are combined with each other.

The matching controller 316 includes a micro-computer, and controls the positions $PC_3$ and $PC_3$ (variable condenser step) of the condenser 120 and the condenser 124 through a rotation control of the motor 312 and the motor 314 such that the measurement value $MZ_{L\_HF}$ output from the impedance sensor 310 becomes identical or closer to a matching point (in general, 50Ω) that is equivalent to the output impedance of the second high frequency power supply 30.

The first high frequency power feed unit 108 includes a low pass filter 130 between the first matcher 100 and the power feed rod 34. The low pass filter 130 is an L-shaped filter, and includes an inductor 126 and a condenser 128. The inductor 126 is connected between the first matcher 100 and the power feed rod 34, and the condenser 128 is connected between the terminal of the inductor 126 on the first matcher 100 side and a ground potential member. The low pass filter 130 passes the first high frequency wave LF from the first matcher 100 and the modulated DC voltage $B_{DC}$ from the voltage application unit DA1 toward the susceptor 12 side, and blocks the second high frequency wave HF from the second high frequency power feed unit 110.

In addition, within the second high frequency power feed unit 110, the coil 118 and the coil 122, which are transformer-coupled to each other in the second matcher 102, are adapted to cut off the first high frequency wave LF from the first high frequency power feed unit 108.

In an exemplary embodiment, the matching unit 321 is provided with a relay switch 132 for primarily security-grounding. One side terminal of the relay switch 132 is connected to a ground potential member through the resistor 134. The other side terminal of the relay switch 132 is connected to a high frequency transmission line within the first matcher 100 (the connection point NA between the condenser 114 and the inductor 116 in the illustrated exemplary circuit configuration) through a high frequency wave cut-off filter 140. The high frequency wave cut-off filter 140 includes an inductor 136 and a condenser 138. The inductor 136 is connected between the relay switch 132 and the connection point NA. The condenser 138 is connected between the terminal of the inductor 6 on the relay switch 132 side and a ground potential member. The high frequency wave cut-off filter 140 includes a filter characteristic that passes the modulated DC voltage $B_{DC}$ and blocks another high frequency wave, i.e., the first high frequency wave LF.

When the relay switch 132 is turned OFF, the connection point NA within the first matcher 100 is in the electrically floating state (particularly, for DC). Accordingly, the susceptor 12 also becomes in the floating state. When the relay switch 132 is turned ON, charges that are accumulated in the susceptor 12 prior to ON transiently flow to the ground potential member through the connection point NA, the high frequency wave cut-off filter 140, the relay switch 132, and the resistor 134. In addition, the time when the relay switch 132 is turned OFF is a time in a period until the second high frequency wave HF is output after the substrate is placed on the susceptor 12, and the processing gas from the processing gas supply unit 80 is supplied into the processing container 10. The time when the relay switch 132 is turned ON is a time before the lift pints 58 are moved up in order to carry out the substrate from the processing container 10. ON/OFF of the relay switch 132 is controlled by a control signal applied from the matching controller 216 to the relay switch 132.

In the first exemplary circuit configuration, the first high frequency power supply 28 outputs the first pulse-modulated high frequency wave, i.e., the modulated high frequency wave $LF_{PM}$ (see FIG. 6). As illustrated in FIG. 6, one cycle of the pulse modulation is divided into a first period T1 and a second period T2 that follows the first period T1. As illustrated in the timing chart of the modulated high frequency wave $LF_{PM}$ in FIG. 6, the first high frequency wave LF is supplied to the susceptor 12 in the first period T1 (ON in FIG. 6), and the supply of the first high frequency wave LF to the susceptor 12 is stopped in the second period T2 (OFF in FIG. 6). In addition, the first high frequency wave LF of a first power may be supplied to the susceptor 12 in the first period T1, and the first high frequency wave LF of a second power smaller than the first power may be supplied to the susceptor 12 in the second period 2. The first high frequency power supply 28 outputs the pulse signal PS, which is synchronized with the modulated high frequency wave $LF_{PM}$. The pulse signal PS has a first signal level LV1 in the first period T1, and a second signal level LV2 in the second period T2.

When the modulated high frequency wave $LF_{PM}$ is applied to the susceptor 12, the potential $V_{DC}$ of the substrate W periodically fluctuates in synchronization with the modulated high frequency wave $LF_{PM}$, as illustrated in FIG. 6. That is, the potential $V_{DC}$ of the substrate W becomes a negative polarity potential in the first period T1, and a potential of substantially zero (0) V in the second period. In order to reduce the difference between the potential of the substrate W and the potential of the susceptor 12, the voltage application unit DA1 is provided in parallel with the relay switch 132, as illustrated in FIG. 5. The voltage application unit DA1 outputs the modulated DC voltage $B_{DC}$.

Specifically, the voltage application unit DA1 is connected to the high frequency wave cut-off filter 140 through the resistor 142 in parallel with the relay switch 132, and connected to the connection point NA through the high frequency wave cut-off filter 140. The resistor 142 constitutes the high frequency wave cut-off filter of a subsequent stage to thoroughly cut off another high frequency wave, i.e., the first high frequency wave LF, that may be leaked from the high frequency wave cut-off filter 140 in a previous stage.

The voltage application unit DA1 includes a DC power supply 104, a switching device SW1, and a time constant adjustment circuit TC1. The DC power supply 104 is a variable DC power supply that generates a negative polarity DC voltage, and is capable of adjusting a voltage value of the DC voltage to be output. The DC power supply 104 is connected to the resistor 142. The switching device SW1 includes a first terminal, a second terminal, and a control terminal. The switching device SW1 is a device that switches a conduction state between the first terminal and the second terminal by an electrical signal that is input into the control terminal. For example, a field effect transistor may be used for the switching device SW1. According to the field effect transistor, the life time of the switching device SW1 may be lengthened, compared to a mechanical switch. The first terminal of the switching device SW1 is connected to a node NA1 between the resistor 142 and the DC power supply 104 through a time constant adjustment circuit TC1. The second terminal of the switching device SW1 is connected to a ground potential member. The pulse signal PS is applied to the control terminal of the switching device SW1 from the first high frequency power supply 28.

When the pulse signal PS of the first signal level LV1 is applied to the control terminal of the switching device SW1 in the first period T1, the conduction between the first terminal and the second terminal of the switching device SW1 is disconnected. Accordingly, the DC voltage of the DC power supply 104 is applied to the susceptor 12. That is, as illustrated in FIG. 6, the voltage value of the modulated DC voltage $B_{DC}$ in the first period T1 becomes the negative polarity $B_{DC}(T1)$. Meanwhile, when the pulse signal PS of the second signal level LV2 is applied to the control terminal of the switching device SW1 in the second period T2, the first terminal and the second terminal of the switching device SW1 are conducted with each other. Accordingly, the application of the DC voltage of the DC power supply 104 to the susceptor 12 is stopped. That is, as illustrated in FIG. 6, the voltage value of the modulated DC voltage $B_{DC}$ in the second timer period T2 becomes, for example, $B_{DC}(T2)$ of about zero (0) V.

As illustrated in FIG. 6, while the potential $V_{DC}$ of the substrate W is synchronized with the modulated high frequency wave $LF_{PM}$, a delay occurs in the fall and rise of the potential. In order to cope with the delay, the fall and rise of the modulated DC voltage $B_{DC}$ are adjusted by a time constant adjustment circuit TC1. In addition, the time constant adjustment circuit TC1 may be, for example, a resistance device connected between the node NA1 and the switching device SW1.

In the first exemplary circuit configuration, the voltage value of the modulated DC voltage $B_{DC}$ is controlled depending on the voltage amplitude $V_{PP\_LF}$ of the first high frequency wave LF (the modulated high frequency wave $LF_{PM}$ in the first exemplary circuit configuration) by using the proportional relation between the potential $V_{DC}$ of the substrate W and the voltage amplitude $V_{PP}$ of the first high frequency wave LF. For this reason, an amplitude measurement unit 146 is provided on the high frequency transmission line of the first high frequency power feed unit 108 so as to measure the voltage amplitude $V_{PP\_LF}$ of the first high frequency wave LF. In an exemplary embodiment, a RF power monitor 148 may be further provided on the high frequency transmission line in order to measure a traveling wave power $P_{f\_LF}$ and a reflected wave power $P_{r\_LF}$ of the first high frequency wave LF. Further, the RF power monitor 148 may include, for example, a directional coupler.

The amplitude measurement unit 146 outputs a measurement value $MV_{PP\_LF}$ of the voltage amplitude $V_{PP\_LF}$ on the high frequency transmission line to a voltage controller 144. The voltage controller 144 may constitute a part of the main controller 84. The voltage controller 144 receives a pulse signal PS, and calculates the voltage value $B_{DC}(T1)$ of the modulated DC voltage $B_{DC}$ from the measurement value $MV_{PP\_LF}$ in the first period T1, i.e., the measurement value $MV_{PP\_LF}(T1)$ when the pulse signal PS has a first signal level LV1. For example, the voltage controller 114 calculates the voltage value $B_{DC}(T1)$ having a negative value, according to the following Equation (1). Here, K1 is a positive coefficient.

$$B_{DC}(T1) = -K1 \times MV_{PP\_LF}(T1) \quad (1)$$

The voltage controller 144 controls the DC power supply 104 such that the voltage value of the DC voltage output by the DC power supply 104 in the first period T1 becomes $B_{DC}(T1)$. Accordingly, in the first period T1, the absolute value of the voltage value of the modulated DC voltage $B_{DC}$ increases as the voltage amplitude $V_{PP\_LF}$ increases.

However, when the load of plasma varies when the plasma processing is started or during the plasma processing, the proportional relation between the potential $V_{DC}$ of the substrate W and the voltage amplitude $V_{PP\_LF}$ may be destroyed so that the absolute value of the potential $V_{DC}$ may become smaller than $K \times V_{PP\_LF}$. In this case, the RF power is not sufficiently absorbed to the plasma load, so that the reflected wave power $P_{r\_LF}$ increases.

In order to cope with the variation of the plasma load, the voltage controller 144 may calculate the voltage value $B_{DC}(T1)$ by using the measurement value $MV_{PP\_LF}(T1)$ and the measurement value $MP_{r\_LF}$ of the reflected wave power of the RF power monitor 148 in the first period T1, i.e., $MP_{r\_LF}(T1)$. Specifically, the voltage controller 144 may calculate the voltage value $B_{DC}(T1)$ according to the following Equation (2) or the following Equation (3). J1 and D1 are positive coefficients.

$$B_{DC}(T1) = -(K1 \times MV_{PP\_LF}(T1) - J1 \times MP_{r\_LF}(T1)) \quad (2)$$

$$B_{DC}(T1) = -(K1 - D1 \times MP_{r\_LF}(T1)) \times MV_{PP\_LF}(T1) \quad (3)$$

In order to further improve stability and accuracy of the variable control of the voltage value of the DC voltage $B_{DC}$ with respect to the plasma load variation, the voltage controller 144 may calculate the voltage value $B_{DC}(T1)$ by using a measurement value $MP_{f\_LF}$ of the traveling wave power ($P_{f\_LF}$) of the RF power monitor 148 in the first period T1, i.e., $MP_{f\_LF}(T1)$, in addition to the measurement value $MV_{PP\_LF}(T1)$ and the measurement value $MP_{r\_LF}(T1)$. For example, the voltage controller 144 may calculate the voltage value $B_{DC}(T1)$ according to the following Equation (4). E1 is a positive coefficient.

$$B_{DC}(T1) = -K1*MV_{PP\_LF}(T1)*E1*(MP_{f\_LF}(T1) - MP_{r\_LF}(T1))/MP_{f\_LF}(T1) \qquad (4)$$

Second Example of Matching Unit and Voltage Application Unit

Figure 7:
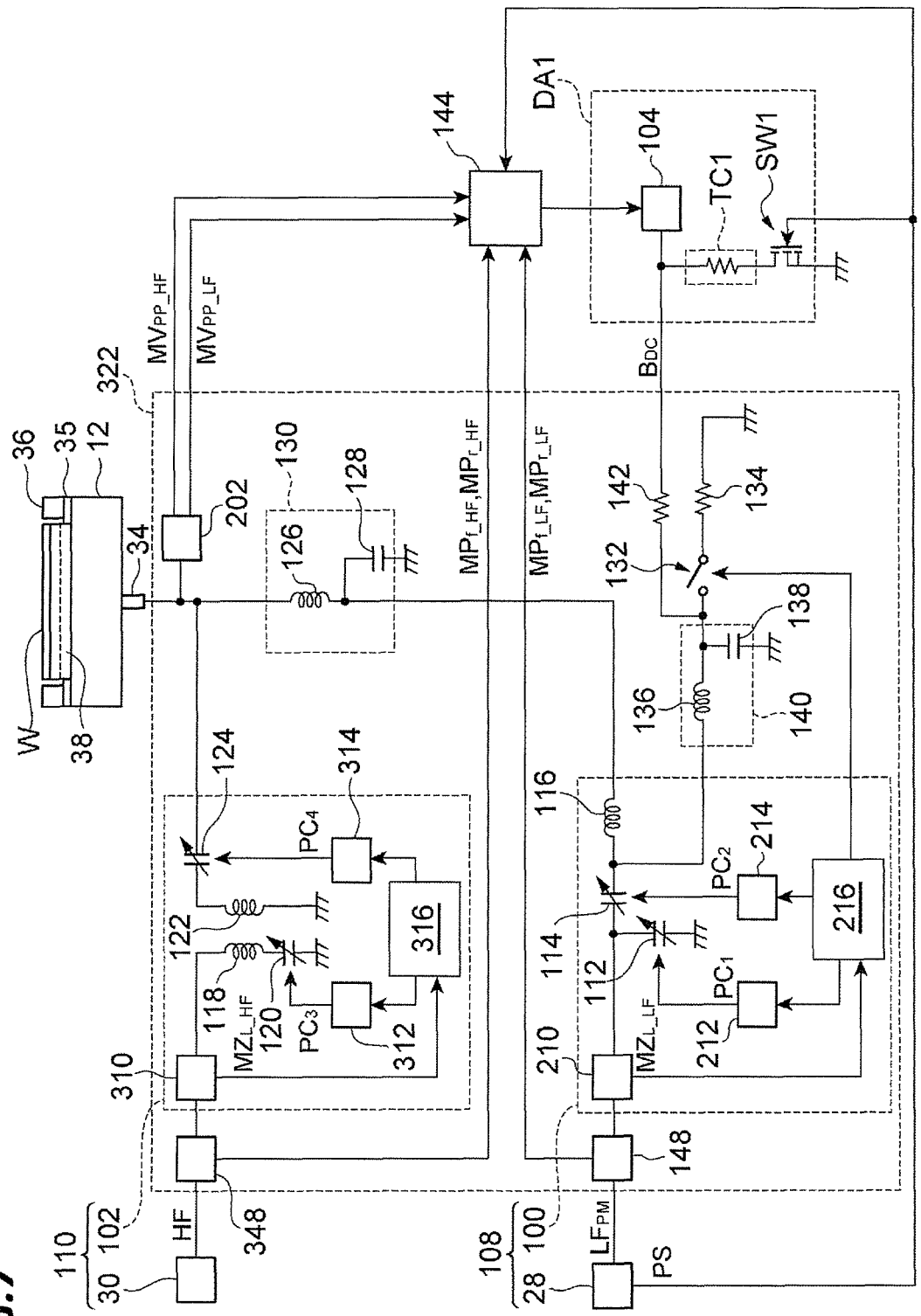
FIG. 7 is a view illustrating a second exemplary circuit configuration of the matching unit and the voltage application unit.

FIG. 7 is a view illustrating a second exemplary circuit configuration of the matching unit and the voltage application unit. The second exemplary circuit configuration is a circuit configuration according to a modification of the first exemplary circuit configuration and is used when the voltage amplitude of the second high frequency wave HF is not negligible. Hereinafter, descriptions will be made on differences of the second exemplary circuit configuration from the first exemplary circuit configuration.

As illustrated in FIG. 7, a matching unit 322 of the second exemplary circuit configuration is different from the matching unit 321 in that an amplitude measurement unit 202 is provided, instead of the amplitude measurement unit 146. The amplitude measurement unit 202 is provided on a high frequency transmission line between the low pass filter 130 and the power feed rod 34. The amplitude measurement unit 202 distinctively measures a voltage amplitude $V_{PP\_LF}$ of the first high frequency wave LF and a voltage amplitude $V_{PP\_HF}$ of the second high frequency wave HF by using, for example, the Super-heterodyne type filter circuit. The amplitude measurement unit 202 applies a measurement value $MV_{PP\_LF}$ of the voltage amplitude $V_{PP\_LF}$ and a measurement value $MV_{PP\_HF}$ of the voltage amplitude $V_{PP\_HF}$ to the voltage controller 144.

The voltage controller 114 calculates the voltage value $B_{DC}(T1)$ of the modulated DC voltage $B_{DC}$ in the first period T1, from the measurement value $MV_{PP\_LF}(T1)$ and the measurement value $MV_{PP\_HF}$ in the first period T1, i.e., $MV_{PP\_HF}(T1)$ when the pulse signal PS has the first signal level LV1, according to the following Equation (5). K2 is a positive coefficient.

$$B_{DC}(T1) = -K1 \times MV_{PP\_LF}(T1) - K2 \times MV_{PP\_HF}(T1) \qquad (5)$$

In an exemplary embodiment, a RF power monitor 348 may be further provided in the second exemplary circuit configuration. The RF power monitor 348 measures a traveling wave power $P_{f\_HF}$ and a reflected wave power $P_{r\_HF}$ of the second high frequency wave HF. The RF power monitor 348 applies a measurement value $MP_{f\_HF}$ of the traveling wave power $P_{f\_HF}$ and a measurement value $MP_{r\_HF}$ of the reflected wave power $P_{r\_HF}$ to the voltage controller 144. In the present exemplary embodiment, the voltage controller 144 calculates the voltage value $B_{DC}(T1)$ of the modulated DC voltage $B_{DC}$ in the first period T1, when the pulse signal PS has the first signal level LV1, according to any one of the following Equations (6) to (8). J2, D2, and E2 are positive coefficients. $MP_{f\_HF}(T1)$ is the measurement value $MP_{f\_HF}$ in the first period T1, and $MP_{r\_HF}(T1)$ is the measurement value $MP_{r\_HF}$ in the first period.

$$B_{DC}(T1) = -(K1 \times MV_{PP\_LF}(T1) - J1 \times MP_{r\_LF}(T1)) - (K2 \times MV_{PP\_HF}(T1) - J2 \times MP_{r\_HF}(T1)) \qquad (6)$$

$$B_{DC}(T1) = -(K1 - D1 \times MP_{r\_LF}(T1)) \times MV_{PP\_LF}(T1) - (K2 - D2 \times MP_{r\_HF}(T1)) \times MV_{PP\_HF}(T1) \qquad (7)$$

$$B_{DC}(T1) = -K1*MV_{PP\_LF}(T1)*E1*(MP_{f\_LF}(T1) - MP_{r\_LF}(T1))/MP_{f\_LF}(T1) - K2*MV_{PP\_HF}(T1) *E2*(MP_{f\_HF}(T1) - MP_{r\_HF}(T1))/MP_{f\_HF}(T1) \qquad (8)$$

Third Example of Matching Unit and Voltage Application Unit

Figure 8:
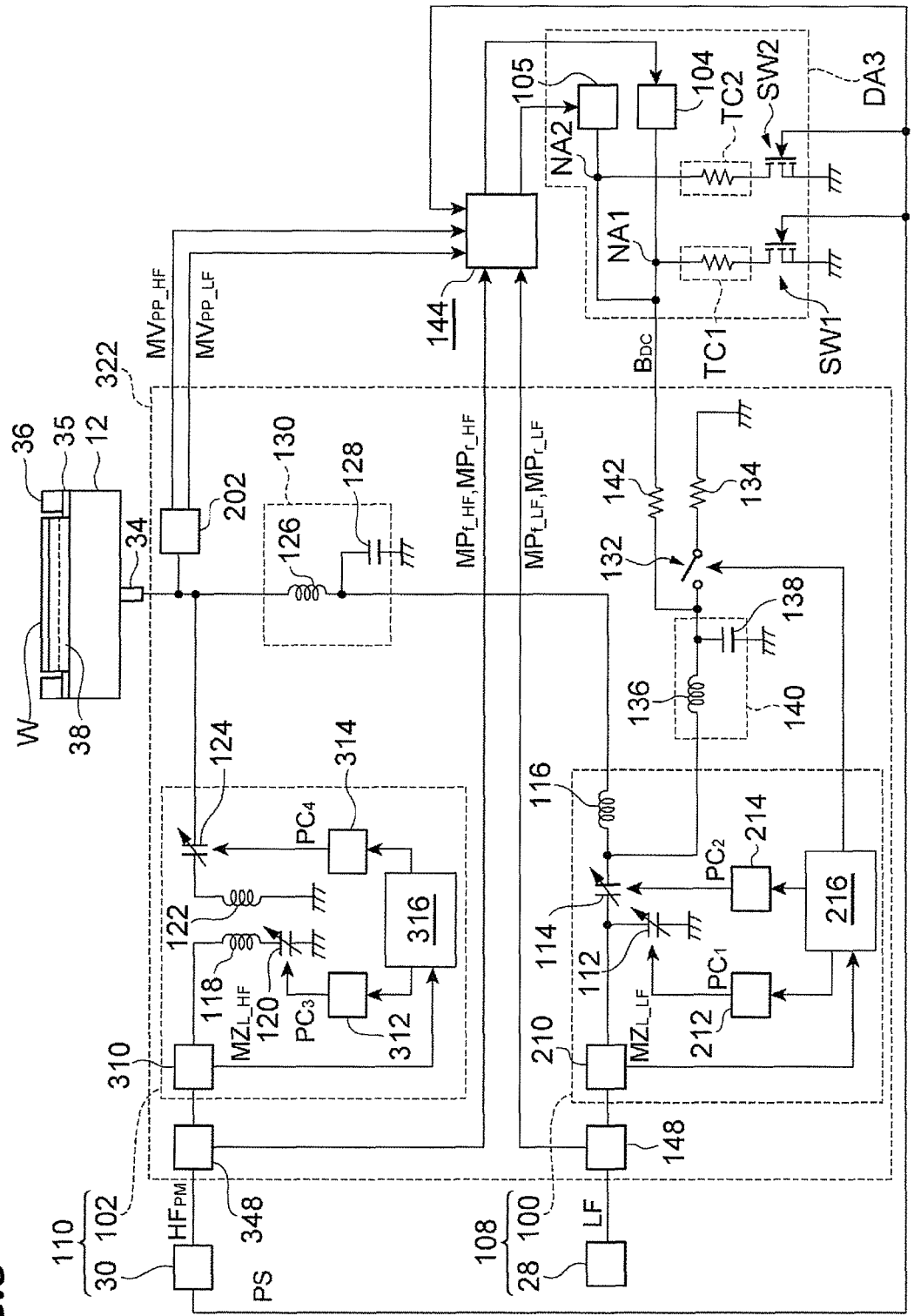
FIG. 8 is a view illustrating a third exemplary circuit configuration of the matching unit and the voltage application unit.
Figure 9:
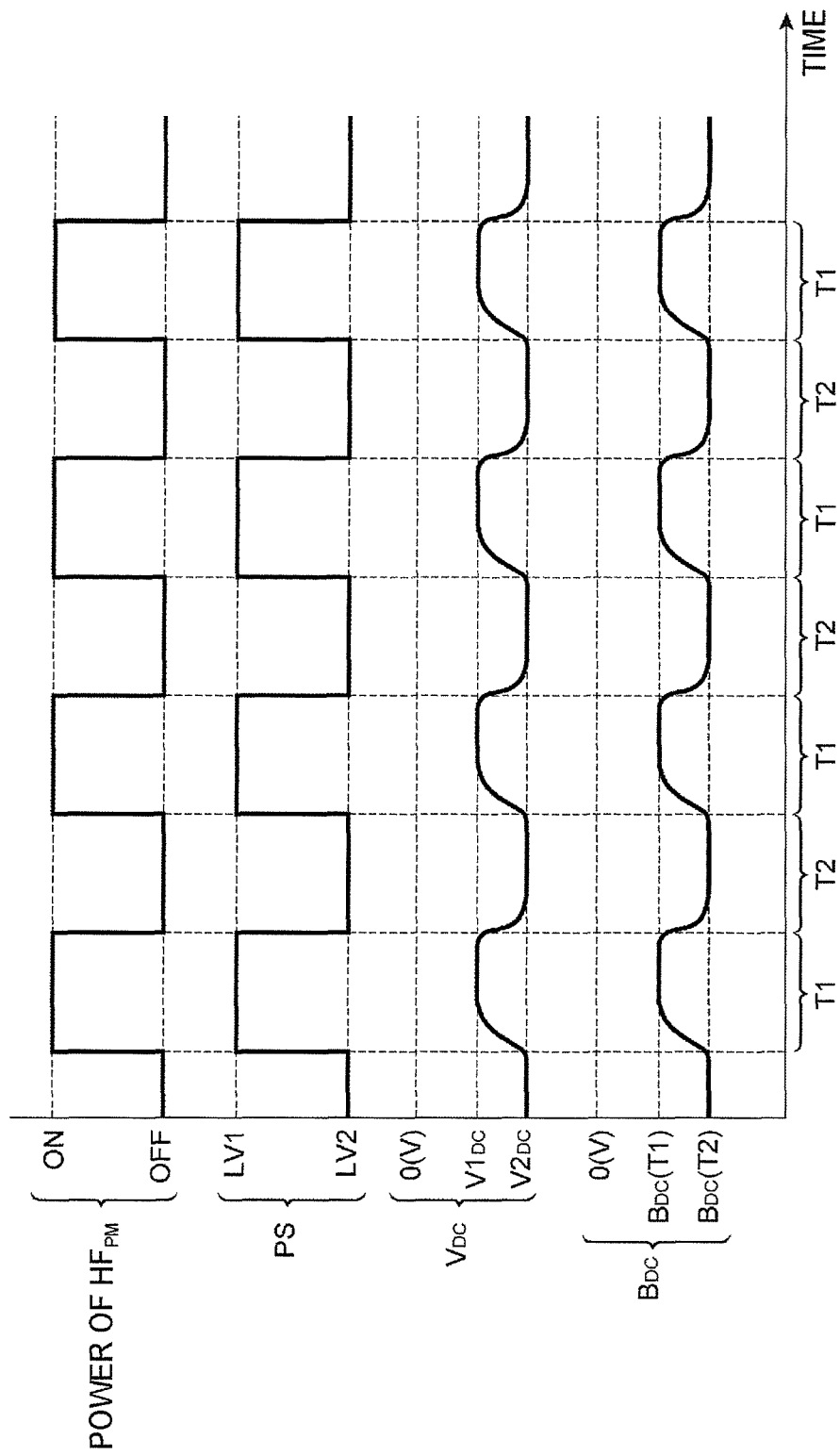
FIG. 9 is a view exemplifying a timing chart of the modulated high frequency wave, the pulse signal, the potential of the substrate, and the modulated DC voltage of the voltage application unit.

FIG. 8 is a view illustrating a third exemplary circuit configuration of the matching unit and the voltage application unit. FIG. 9 is a view exemplifying a timing chart of the modulated high frequency wave, the pulse signal, the potential of the substrate, and the modulated DC voltage of the voltage application unit. The third exemplary circuit configuration includes the matching unit 322, which is the same as the matching unit of the second exemplary circuit configuration.

In the third exemplary circuit configuration, the first high frequency wave LF is continuously applied to the susceptor 12 without being pulse-modulated, and only the second high frequency wave HF is pulse-modulated. That is, the second high frequency power supply 30 outputs the second pulse-modulated high frequency wave HF, i.e., the modulated high frequency wave $LH_{PM}$ (see FIG. 9). The second high frequency wave HF is supplied to the susceptor 12 (ON in FIG. 9) in the first period T1, and the supply of the second high frequency wave HF to the susceptor 12 is stopped (OFF in FIG. 9) in the second period T2. In addition, the second high frequency wave HF of a first power may be supplied to the susceptor 12 in the first period T1, and the second high frequency wave HF of a second power lower than the first power may be supplied to the susceptor 12 in the second period T2. The second high frequency power supply 30 outputs the pulse signal PS, which is synchronized with the modulated high frequency wave $HF_{PM}$.

When the modulated high frequency wave $HF_{PM}$ is applied to the susceptor 12, the potential $V_{DC}$ of the substrate W periodically fluctuates in synchronization with the modulated high frequency wave $HF_{PM}$, as illustrated in FIG. 9. Specifically, the potential $V_{DC}$ of the substrate W becomes the negative polarity potential $V1_{DC}$ in the first period T1, and the negative polarity potential $V2_{DC}$ in the second period T2. The absolute value of the potential $V2_{DC}$ becomes larger than the absolute value of the potential $V1_{DC}$. In order to reduce the difference between the potential of the substrate W and the potential of the susceptor 12, a voltage application unit DA3 is provided in parallel with the relay switch 132, as illustrated in FIG. 8, in the third exemplary circuit configuration. The voltage application unit DA3 is used as the voltage application unit DA of the plasma processing apparatus 1 of FIG. 2, and outputs the modulated DC voltage $B_{DC}$.

The voltage application unit DA3 includes a DC power supply 104, a DC power supply 105, a switching device SW1, a switching device SW2, a time constant adjustment circuit TC1, and a time constant adjustment circuit TC2. The DC power supply 104 is a variable DC power supply that generates a negative polarity DC voltage, and is capable of adjusting a voltage value of the DC voltage to be output. The DC power supply 104 outputs the DC voltage [the voltage value $B_{DC}(T1)$] to be applied to the susceptor 12 in the first period T1. The DC power supply 105 is a variable DC power supply that generates a negative polarity DC voltage, and is capable of adjusting a voltage value of the DC voltage to be output. The DC power supply 105 outputs the DC voltage (the voltage value $B_{DC}(T2)$) to be applied to the susceptor 12 in the second period T2. The DC power supply 104 and the DC power supply 105 are connected to each other in parallel with the resistor 142.

The switching device SW2 includes a first terminal, a second terminal, and a control terminal, like the switching device SW1. The switching device SW2 is a device that switches the conduction state between the first terminal and the second terminal by an electrical signal that is input into the control terminal. For example, a field effect transistor may be used for the switching device SW2. The first terminal of the switching device SW2 is connected to a node NA2 between the resistor 142 and the DC power supply 105 via the time constant adjustment circuit TC2. The second terminal of the switching device SW2 is connected to a ground potential member. The pulse signal PS is applied to the control terminal of the switching device SW2 from the second high frequency power supply 30.

When the pulse signal PS of the first signal level LV1 is applied to the control terminal of the switching device SW1 in the first period T1, the conduction between the first terminal and the second terminal of the switching device SW1 is disconnected. Meanwhile, when the pulse signal PS of the first signal level LV1 is applied to the control terminal of the switching device SW2 in the first period T1, the first terminal and the second terminal of the switching device SW2 are conducted with each other. Accordingly, only the DC voltage of the DC power supply 104 is applied to the susceptor 12 in the first period T1. As a result, the voltage value of the modulated DC voltage $B_{DC}$ in the first period T1 becomes a negative value $B_{DC}(T1)$, as illustrated in FIG. 9.

When the pulse signal PS of the second signal level LV2 is applied to the control terminal of the switching device SW1 in the second period T2, the first terminal and the second terminal of the switching device SW1 are conducted with each other. Meanwhile, when the pulse signal PS of the second signal level LV2 is applied to the control terminal of the switching device SW2 in the second period T2, the conduction between the first terminal and the second terminal of the switching device SW2 is disconnected. Accordingly, only the DC voltage of the DC power supply 105 is applied to the susceptor 12 in the second period T2. As a result, the voltage value of the modulated DC voltage $B_{DC}$ in the second period T2 becomes a negative value $B_{DC}(T2)$, as illustrated in FIG. 9. In addition, the absolute value of $B_{DC}(T2)$ is larger than the absolute value of $B_{DC}(T1)$.

As illustrated in FIG. 9, while the potential $V_{DC}$ of the substrate W is synchronized with the modulated high frequency wave $HF_{PM}$, a delay occurs in the fall and the rise of the potential. In order to cope with the delay, the fall and the rise of the modulated DC voltage $B_{DC}$ are adjusted by the time constant adjustment circuit TC1 and the time constant adjustment circuit TC2. In addition, the time constant adjustment circuit TC2 may be, for example, a resistance device that is connected between the node NA2 and the switching device SW2.

In the third exemplary circuit configuration, the voltage value of the DC voltage $B_{DC}$ is controlled depending on the voltage amplitude $V_{PP\_LF}$ of the first high frequency wave LF and the voltage amplitude $V_{PP\_HF}$ of the second high frequency wave HF (the modulated high frequency wave $HF_{PM}$ in the present exemplary embodiment). Thus, the measurement value $MV_{PP\_LF}$ of the voltage amplitude $V_{PP\_LF}$ and the measurement value $MV_{PP\_HF}$ of the voltage amplitude $V_{PP\_HF}$ are applied from the amplitude measurement unit 202 to the voltage controller 144 in the third exemplary circuit configuration.

The voltage controller 144 receives the pulse signal PS, and calculates $B_{DC}(T1)$ when the pulse signal PS has the first signal level LV1, i.e., in the first period T1, according to the Equation (5). The voltage controller 144 controls the DC power supply 104 such that the voltage value of the DC voltage output by the DC power supply 104 in the first period T1 becomes $B_{DC}(T1)$.

In addition, the voltage controller 144 receives the pulse signal PS, and calculates the voltage value $B_{DC}(T2)$ of the modulated DC voltage $B_{DC}$ from the measurement value $MV_{PP\_LF}$ and the measurement value $MV_{PP\_HF}$ in the second period T2, i.e., the measurement value $MV_{PP\_LF}(T2)$ and the measurement value $MV_{PP\_HF}(T2)$ when the pulse signal PS has the second signal level LV2, according to the following Equation (9). The voltage controller 144 controls the DC power supply 105 such that the voltage value of the DC voltage output by the DC power supply 105 in the second period T2 becomes $B_{DC}(T2)$.

$$B_{DC}(T2) = -K1 \times MV_{PP\_LF}(T2) - K2 \times MV_{PP\_HF}(T2) \tag{9}$$

In addition, the voltage controller 144 may calculate the voltage value $B_{DC}(T1)$ according to any one of Equations (6) to (8). The voltage controller 144 may calculate the voltage value $B_{DC}(T2)$ according to any one of the following Equations (10) to (12). In addition, $MP_{f\_HF}(T2)$ is the measurement value $MP_{f\_HF}$ in the second period T2, and $MP_{r\_LF}(T2)$ is the measurement value $MP_{r\_LF}$ in the second period T2.

$$B_{DC}(T2) = -(K1 \times MV_{PP\_LF}(T2) - J1 \times MP_{r\_LF}(T2)) - (K2 \times MV_{PP\_HF}(T2) - J2 \times MP_{r\_HF}(T2)) \tag{10}$$

$$B_{DC}(T2) = -(K1 - D1 \times MP_{r\_LF}(T2)) \times MV_{PP\_LF}(T2) - (K2 - D2 \times MP_{r\_HF}(T2)) \times MV_{PP\_HF}(T2) \tag{11}$$

$$B_{DC}(T2) = -K1 * MV_{PP\_LF}(T2) * E1 * (MP_{f\_LF}(T2) - MP_{r\_LF}(T2))/MP_{f\_LF}(T2) - K2 * MV_{PP\_HF}(T2) * E2 * (MP_{f\_HF}(T2) - MP_{r\_HF}(T2))/MP_{f\_HF}(T2) \tag{12}$$

Forth Example of Matching Unit and Voltage Application Unit

In the first to third examples described above, the voltage value of the modulated voltage $B_{DC}$ is calculated based on the voltage amplitude. However, a voltage value that has already been registered in a data table may be used as the voltage value of the modulated DC voltage $B_{DC}$. The voltage value in the data table is the voltage value of the modulated DC voltage that is capable of suppressing discharge and is calculated by, for example, a preliminary experiment. This data table may be stored in a predetermined storage device, which may be referred to by the voltage controller 144.

FIG. 10 is a view illustrating an exemplary data table. The data table DT illustrated in FIG. 10 records voltage values of the modulated DC voltage $B_{DC}$ as records which are associated with the modulated frequency of the pulse modulation, the power of the first high frequency wave LF, and the power of the second high frequency wave HF. In FIG. 10, $P_{LF}(p)$ is the power of the first high frequency wave LF, and $P_{HF}(q)$ is the power of the second high frequency wave HF. p and q are indexes. In addition, in FIG. 10, $B_{DC}(r, p, q)$ is the voltage value of the DC voltage $B_{DC}$. r is an index which corresponds to the modulated frequency.

The voltage value $B_{DC}(r, p, q)$ registered in the data table DT illustrated in FIG. 10 may be used as the voltage value $B_{DC}(T1)$. The voltage controller 144 may specify a record in the data table DT depending on the modulated frequency of the pulse modulation, the power of the first high frequency wave LF, and the power of the second high frequency wave HF that are practically used, and use the specified record as the voltage value $B_{DC}(T1)$. When the voltage value $B_{DC}(T2)$ is required, a separate data table, which is prepared for the voltage value $B_{DC}(T2)$ by, for example, a preliminary experiment, may be used, in addition to the data table DT.

Fifth Example of Matching Unit and Voltage Application Unit

Figure 11:
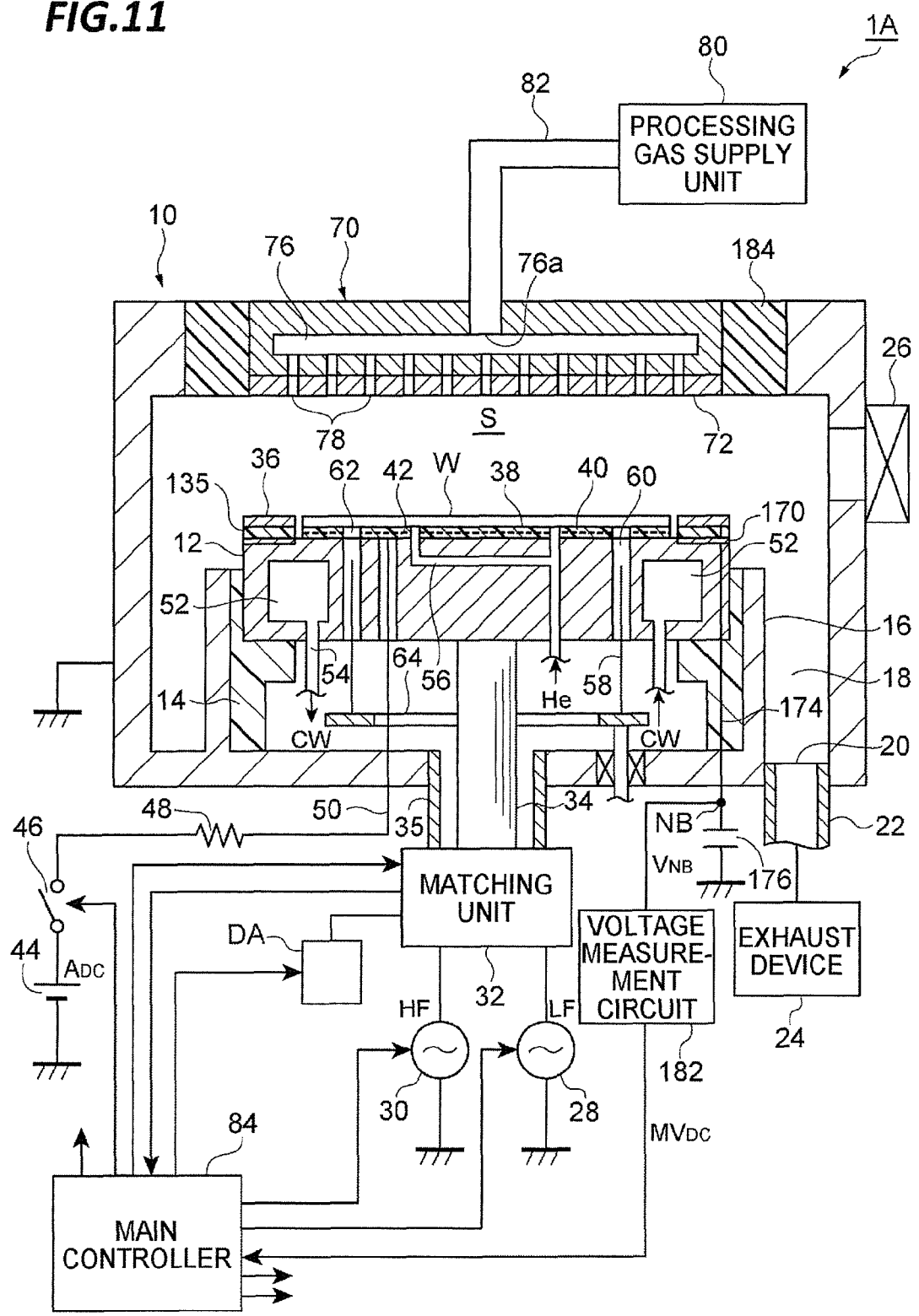
FIG. 11 is a view illustrating a plasma processing apparatus according to another exemplary embodiment.
Figure 12:
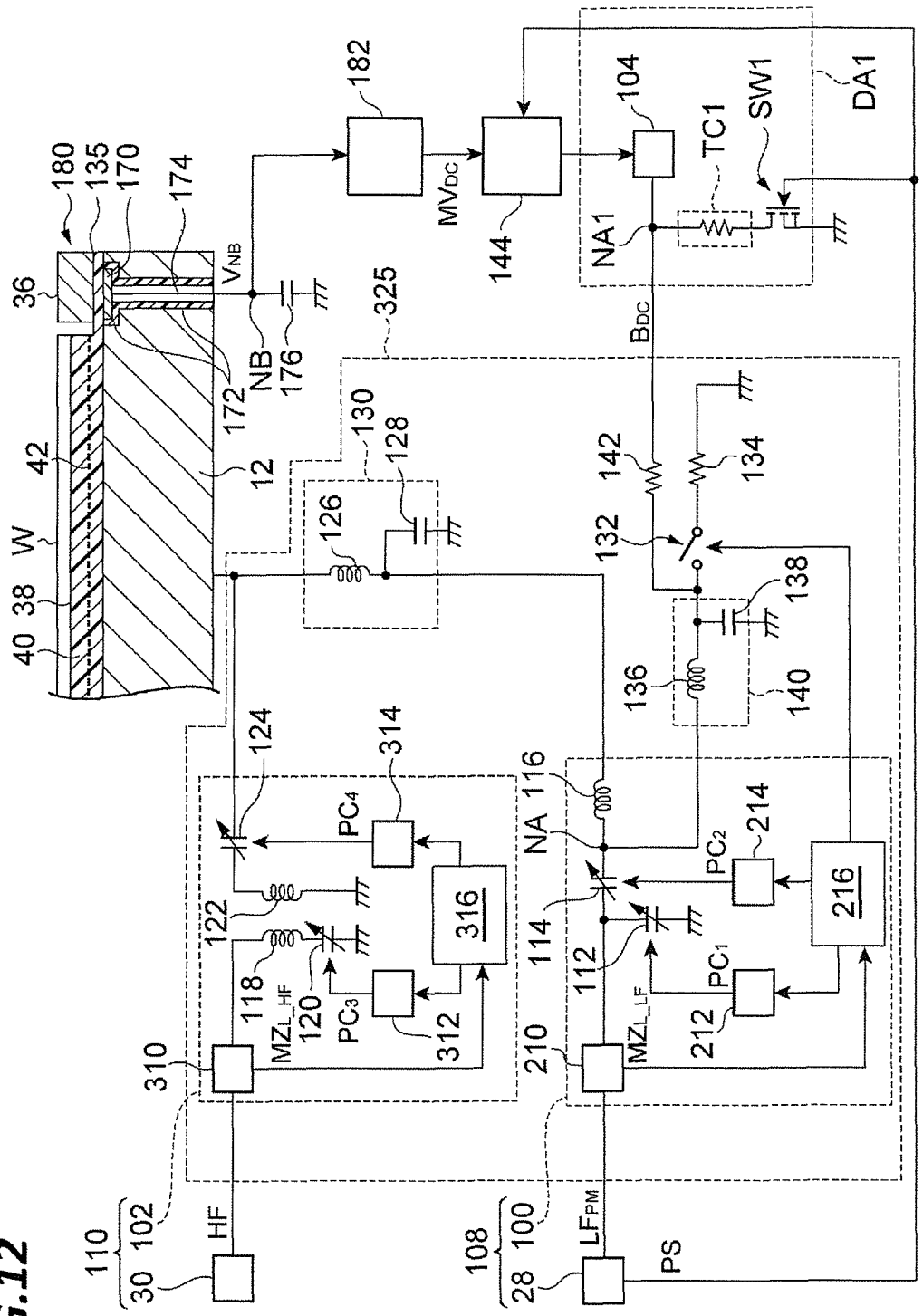
FIG. 12 is a view illustrating a fifth exemplary circuit configuration of the matching unit and the voltage application unit.

In the fifth example, the voltage value of the modulated DC voltage is calculated from the measurement value of the potential of the substrate W. In the fifth example, the plasma processing apparatus 1 is modified as illustrated in FIG. 11. FIG. 11 is a view illustrating a plasma processing apparatus according to another exemplary embodiment. Hereinafter, descriptions will be made on the differences between the plasma processing apparatus 1 and the plasma processing apparatus 1A illustrated in FIG. 11. In the following descriptions, FIG. 12 will also be referred to together with FIG. 11. FIG. 12 is a view illustrating a fifth exemplary circuit configuration of the matching unit and the voltage application unit.

In the plasma processing apparatus 1A, the electrode plate 170 is provided between the dielectric 135 and the peripheral area of the susceptor 12. The electrode plate 170 is electrically insulated from the susceptor 12 by an insulator 172 formed of, for example, ceramic. The electrode plate 170 is connected to a ground potential member through a rod-shaped conductor 174 and a condenser 176. The conductor 174 passes through a through hole formed in the susceptor 12, and is insulated from the susceptor 12.

When self-bias occurs on the surface of the substrate W and the surface of the focus ring 36, that is, when plasma is generated within the processing container 10, the surface of the substrate W and the surface of the focus ring 36 become the negative potential $V_{DC}$ which is identical to the self-bias. Since the focus ring 36 is generally formed of a single material such as Si, the entire focus ring 36 constitutes the electrode plate. That is, the focus ring 36 and the electrode plate 170 with a dielectric 135 being interposed therebetween form a condenser 180. Accordingly, the potential of the surface of the focus ring 36 is voltage-divided by the condenser 180 and the condenser 176, which are connected to each other in series, and a divided voltage $V_{NB}$ (a negative value), which is proportional to the potential of the focus ring, is obtained at a node NB between the condenser 180 and the condenser 176. Here, when electrostatic capacitances of the condenser 180 and the condenser 176 are $C_{180}$ and $C_{176}$, respectively, the divided voltage $V_{NB}$ obtained at the node NB is represented by the following Equation (13).

$$V_{NB}=V_{DC} \times C_{180}/(C_{180}+C_{176}) \tag{13}$$

In the fifth exemplary circuit configuration, a voltage measurement circuit 182 is connected to the node NB. Further, the configuration of the matching unit 325 in the fifth exemplary circuit configuration corresponds to the configuration of the matching unit 320 of the first exemplary circuit configuration, from which the amplitude measurement unit 146 and the RF power monitor 148 are omitted.

The voltage measurement circuit 182 measures the divided voltage $V_{NB}$ of the node NB, and calculates a measurement value $MV_{DC}$ of the potential $V_{DC}$, i.e., a measurement value $MV_{DC}$ of the self-bias potential, from the relation of Equation (13) based on the divided voltage $V_{NB}$. The voltage controller 144 controls the DC power supply 104 of the voltage application unit DA1 such that the DC voltage of the voltage value $B_{DC}(T1)$, which is identical to the measurement value $MV_{DC}$, is applied to the susceptor 12 in the first period T1. In addition, in the fifth exemplary circuit configuration, the first pulse modulated high frequency wave LF, i.e., the modulated high frequency wave $LF_{PM}$, is supplied to the susceptor 12. The second high frequency wave HF may be continuously applied to the susceptor 12 or pulse-modulated in synchronization with the pulse modulation of the first high frequency wave LF to be supplied to the susceptor 12. Accordingly, in the fifth exemplary circuit configuration, the DC voltage value $B_{DC}(T2)$ output by the voltage application unit DA1 in the second period (T2) may be set to a value of about 0 V.

Sixth Example of Matching Unit and Voltage Application Unit

Figure 13:
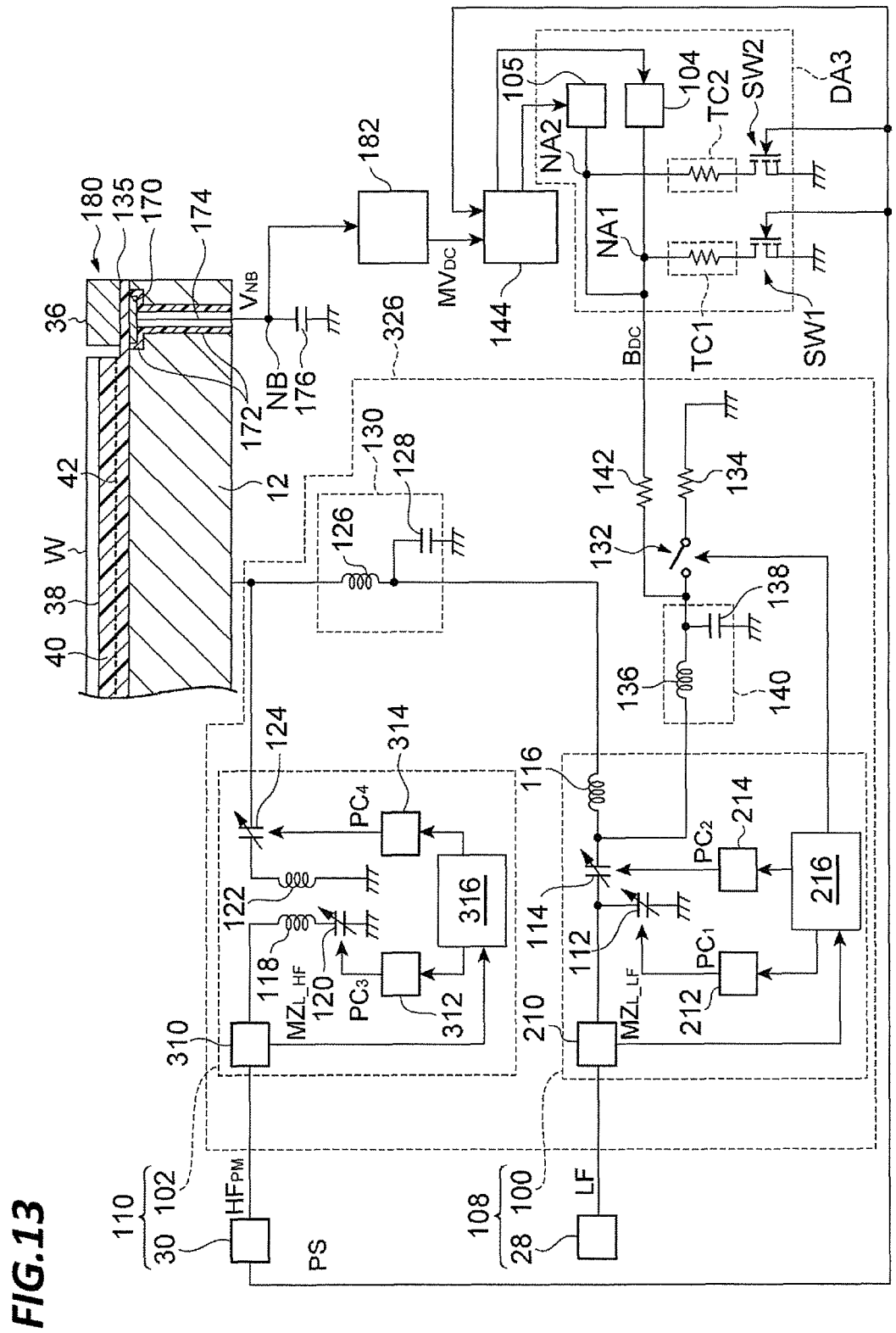
FIG. 13 is a view illustrating a sixth exemplary circuit configuration of the matching unit and the voltage application unit.

FIG. 13 is a view illustrating a sixth exemplary circuit configuration of the matching unit and the voltage application unit. In the sixth exemplary circuit configuration, the voltage value of the modulated DC voltage is calculated from the measurement value of the potential of the substrate W, as in the fifth exemplary circuit configuration. In the sixth exemplary circuit configuration, the second pulse modulated high frequency wave HF, i.e., the modulated high frequency wave $HF_{PM}$, is supplied to the susceptor 12. The configuration of the matching unit 326 in the sixth exemplary circuit configuration corresponds to the configuration of the matching unit 322 illustrated in FIG. 8, from which the amplitude measurement unit 202, the RF power monitor 148, and the RF power monitor 348 are omitted.

In the sixth exemplary circuit configuration, the voltage controller 144 controls the DC power supply 104 of a voltage application unit DA3, such that the DC voltage of the voltage value $B_{DC}(T1)$, which is identical to the measurement value $MV_{DC}(T1)$ of the potential $V_{DC}$ in the first period T1, is applied to the susceptor 12 in the first period T1. Further, the voltage controller 144 controls the DC power supply 105 of the voltage application unit DA3, such that the DC voltage of the voltage value $B_{DC}(T2)$, which is identical to the measurement value $MV_{DC}(T2)$ of the potential $V_{DC}$ in the second period T2, is applied to the susceptor 12 in the second period T2.

Seventh Example of Matching Unit and Voltage Application Unit

Figure 14:
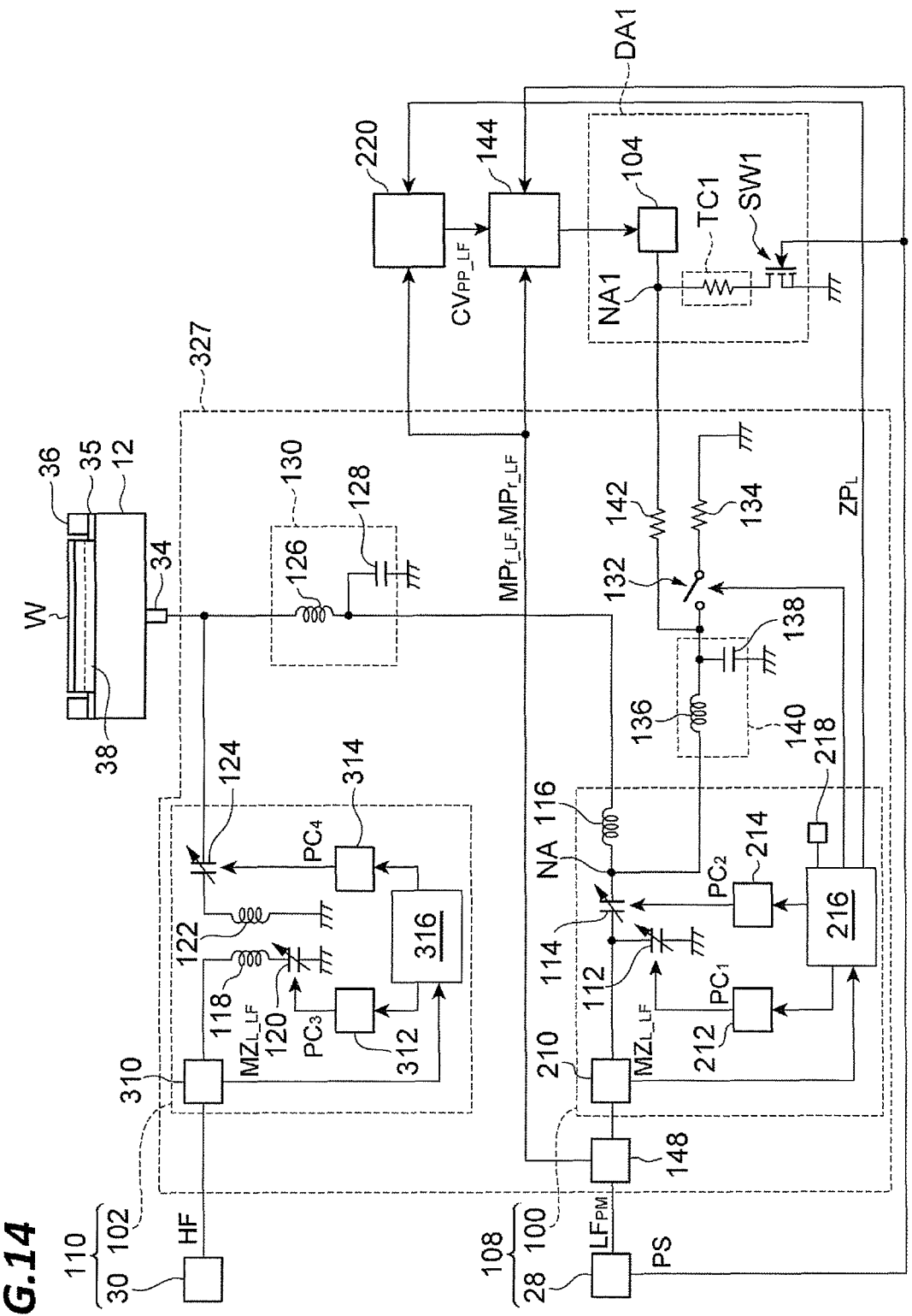
FIG. 14 is a view illustrating a seventh exemplary circuit configuration of the matching unit and the voltage application unit.

FIG. 14 is a view illustrating a seventh exemplary circuit configuration of the matching unit and the voltage application unit. In the seventh exemplary circuit configuration, a calculation value $CV_{PP\_LF}$ of the voltage amplitude $V_{PP\_LF}$ of the first high frequency wave LF is obtained, based on plasma impedance $ZP_L$ for the first high frequency wave LF, which is specified from the position (variable condenser step) $PC_1$ of the condenser 112 and the position (variable condenser step) $PC_2$ of the condenser 114, and the voltage value $B_{DC}(T1)$ of the modulated DC voltage $B_{DC}$ is obtained from the $CV_{PP\_LF}$. In the seventh exemplary circuit configuration, the first pulse modulated high frequency wave LF, i.e., the modulated high frequency wave $LF_{PM}$, is supplied to the susceptor 12. The second high frequency wave HF may be continuously applied to the susceptor 12, or pulse-modulated in synchronization with the pulse modulation of the first high frequency wave LF to be supplied to the susceptor 12.

The configuration of the matching unit 327 employed in the seventh exemplary circuit configuration corresponds to the configuration of the matching unit 321 illustrated in FIG. 5, from which the amplitude measurement unit 146 is omitted. However, a storage device 218, which stores a data table, is connected to the matching controller 216.

The plasma impedance $ZP_L$, which corresponds to the position $PC_1$ of the condenser 112 and the position $PC_2$ of the condenser 114, is registered in the data table stored in the storage device 218.

The matching controller 216 acquires the plasma impedance, which corresponds to the position $PC_1$ of the condenser 112 and the position $PC_2$ of the condenser 114 in the first period T1, as plasma impedance $ZP_L(T1)$, and outputs the plasma impedance $ZP_L(T1)$ to a potential calculation unit 220.

The potential calculation unit 220 calculates a calculation value $CV_{PP\_LF}(T1)$ of the voltage amplitude $V_{PP\_LF}$ in the first period T1 by using the plasma impedance $ZP_L(T1)$, according to the following Equation (14). Here, $R_L(T1)$ is a real part of the plasma impedance $ZP_L(T1)$, and $X_L(T1)$ is an imaginary part of the plasma impedance $ZP_L(T1)$.

$$CV_{PP\_LF}(T1)=\{8\times(MP_{f\_LF}(T1)-P_{r\_LF}(T1))\times(R_L(T1)+X_L(T1)^2/R_L(T1))\}^{1/2} \quad (14)$$

The voltage controller 144 calculates the voltage value $B_{DC}(T1)$ by using the calculation value $CV_{PP\_LF}(T1)$. The voltage controller 144 controls the DC power supply 104 of the voltage application unit DA1 such that the modulated DC voltage $B_{DC}$ has the voltage value $B_{DC}(T1)$ in the first period T1. In addition, the voltage controller 144 may calculate the calculation value $B_{DC}(T1)$ by using the calculation value $CV_{PP\_LF}(T1)$, instead of the measurement value $MV_{PP\_LF}(T1)$, in any one of Equations (1) to (4). In addition, the voltage value $B_{DC}(T2)$ of the modulated DC voltage $B_{DC}$ in the second period T2 may be set to a voltage value of about 0V.

In the present exemplary circuit configuration, the plasma impedance $ZP_L$ is calculated with reference to the data table. However, the matching controller 216 may calculate the plasma impedance $ZP_L$ by tracing the locus on the Smith chart with the current electrostatic capacitance of the condenser 112 and the current electrostatic capacitance of the condenser 114.

In addition, the matching controller 216 may calculate impedance $Z_{100}(T1)$ of the first matcher 100 from the electrostatic capacitance of the condenser 112 and the electrostatic capacitance of the condenser 114 in the first period T1, and calculate the plasma impedance $ZP_L(T1)$ by using the impedance $Z_{100}(T1)$ and the measurement value $MZ_{L\_LH}(T1)$ of the load impedance $Z_{L\_LH}$ in the first period T1 according to the following Equation (15).

$$ZP_L(T1)=MZ_{L\_LH}(T1)-Z_{100}(T1) \quad (15)$$

Eighth Example of Matching Unit and Voltage Application Unit

Figure 15:
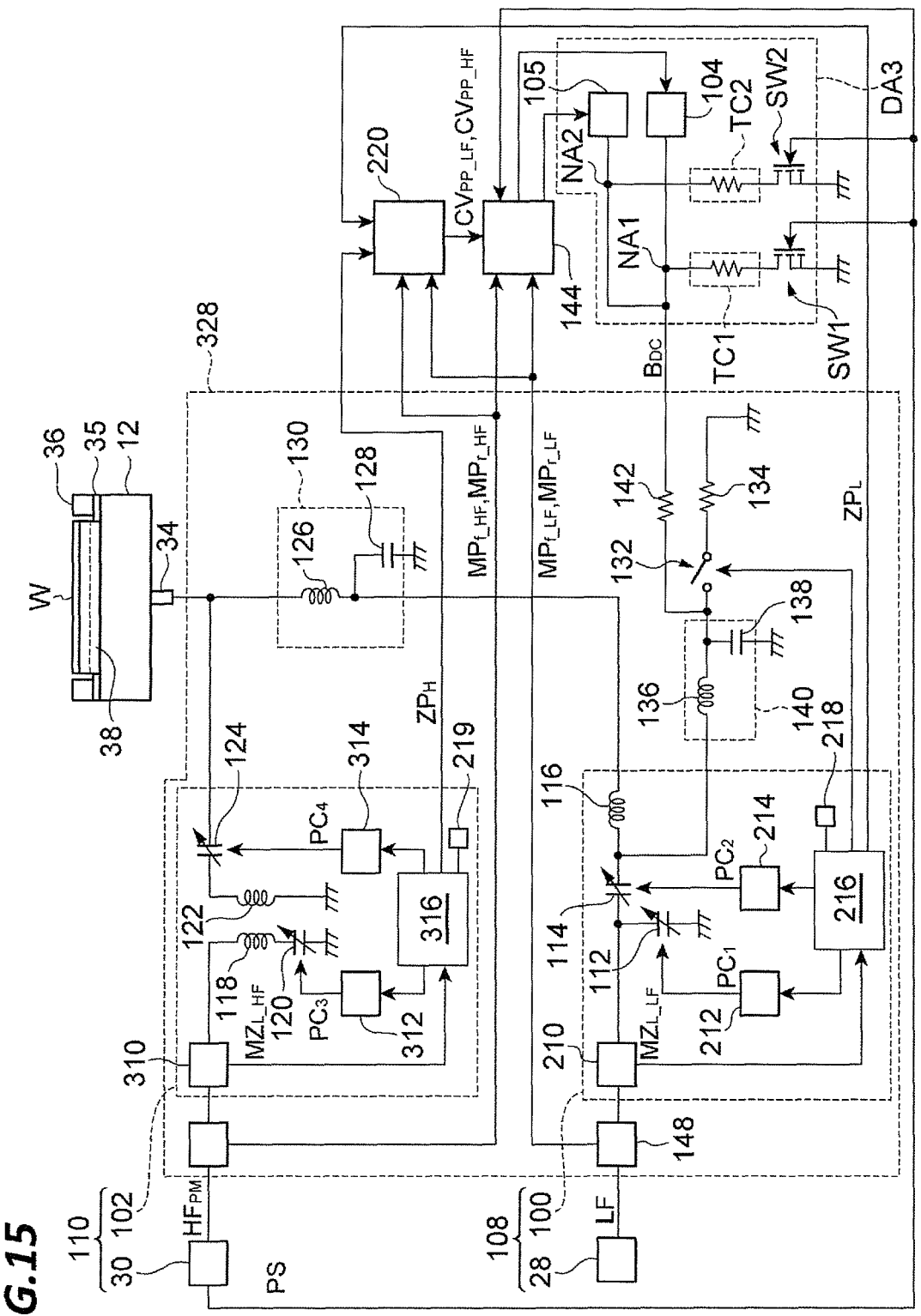
FIG. 15 is a view illustrating an eighth exemplary circuit configuration of the matching unit and the voltage application unit.

FIG. 15 is a view illustrating an eighth exemplary circuit configuration of the matching unit and the voltage application unit. In the eighth exemplary circuit configuration, the calculation value of the voltage amplitude of the high frequency wave is obtained from the plasma impedance, and the voltage value of the modulated DC voltage $B_{DC}$ is obtained from the calculation voltage, as in the seventh exemplary circuit configuration. However, in the eighth exemplary circuit configuration, the first high frequency wave LF is continuously supplied to the susceptor 12 without being pulse-modulated, and the second pulse modulated high frequency wave HF, i.e., the modulated $HF_{PM}$, is supplied to the susceptor 12.

The configuration of the matching unit 328 employed in the eighth exemplary circuit configuration corresponds to the configuration of the matching unit 322 illustrated in FIG. 8, from which the amplitude measurement unit 202 is omitted. However, a storage device 218, which stores a data table, is connected to the matching controller 216, as in the seventh exemplary circuit configuration. Further, a storage device 219, which stores a data table, is connected to the matching controller 316.

A plasma impedance $ZP_H$, which is associated with the position of $PC_3$ of the condenser 120 and the position $PC_4$ of the condenser 124, is registered in the data table stored in the storage device 219.

The matching controller 216 acquires the plasma impedance $ZP_L(T1)$, which is associated with the position $PC_1$ of the condenser 112 and the position $PC_2$ of the condenser 114 in the first period T1, and outputs the plasma impedance $ZP_L(T1)$ to the potential calculation unit 220. Further, the matching controller 216 acquires the plasma impedance $ZP_L(T2)$, which is associated with the position $PC_1$ of the condenser 112 and the position $PC_2$ of the condenser 114 in the second period T2, and outputs the plasma impedance $ZP_L(T2)$ to the potential calculation unit 220.

Likewise, the matching controller 316 acquires a plasma impedance $ZP_H(T1)$ for the second high frequency wave HF, which is associated with the position $PC_3$ of the condenser 120 and the position $PC_4$ of the condenser 124 in the first period T1, and outputs the plasma impedance $ZP_H(T1)$ to the potential calculation unit 220. Further, the matching controller 316 acquires a plasma impedance $ZP_H(T2)$, which is associated with the position $PC_3$ of the condenser 120 and the position $PC_4$ of the condenser 124 in the second period T2, and outputs the plasma impedance $ZP_H(T2)$ to the potential calculation unit 220.

The potential calculation unit 220 calculates a calculation value $CV_{PP\_LF}(T1)]$ of the voltage amplitude $V_{PP\_LF}$ in the first period T1 by using the plasma impedance $ZP_L(T1)$ according to Equation (14). Further, the potential calculation unit 220 calculates a calculation value $CV_{PP\_HF}(T1)$ of the voltage amplitude $V_{PP\_HF}$ in the first period T1 by using the plasma impedance $ZP_H(T1)$ according to the following Equation (16). Here, $R_H(T1)$ is a real part of the plasma impedance $ZP_H(T1)$, and $X_H(T1)$ is an imaginary part of the plasma impedance $ZP_H(T1)$.

$$CV_{PP\_HF}(T1)=\{8\times(MP_{f\_HF}(T1)-MP_{r\_HF}(T1))\times(R_H(T1)+X_H(T1)^2/R_H(T1))\}^{1/2} \quad (16)$$

The voltage controller 144 calculates is the voltage value $B_{DC}(T1)$ by using the calculation value $CV_{PP\_LF}(T1)$ and the calculation value $CV_{PP\_HF}(T1)$. The voltage controller 144 controls the DC power supply 104 of the voltage application unit DA3 such that the modulated DC voltage $B_{DC}$ has the voltage value $B_{DC}(T1)$ in the first period. Further, the voltage controller 144 may calculate the voltage value $B_{DC}(T1)$ by using the calculation value $CV_{PP\_LF}(T1)$, instead of the measurement value $MV_{PP\_LF}(T1)$, and by using the calculation value $CV_{PP\_HF}(T1)$, instead of the measurement value $MV_{PP\_HF}(T1)$, in any one of Equations (5) to (8).

In addition, the potential calculation unit 220 calculates a calculation value $CV_{PP\_LF}(T2)$ of the voltage amplitude $V_{PP\_LF}$ in the second period T2 by using the plasma impedance $ZP_L(T2)$ according to the following Equation (17). Further, the potential calculation unit 220 calculates the calculation value $CV_{PP\_HF}(T2)$ of the voltage amplitude $V_{PP\_HF}$ by using the plasma impedance $ZP_H(T2)$ according to the following Equation (18). Here, $R_L(T2)$ is a real part of the plasma impedance $ZP_L(T2)$, and $X_L(T2)$ is an imaginary part of the plasma impedance $ZP_L(T2)$. In addition, $R_H(T2)$ is a real part of the plasma impedance $ZP_H(T2)$, and $X_H(T2)$ is an imaginary part of the plasma impedance $ZP_H(T2)$.

$$CV_{PP\_LF}(T2) = \{8 \times (MP_{f\_LF}(T2) - MP_{r\_LF}(T2)) \times (R_L(T2) + X_L(T2)^2/R_L(T2))\}^{1/2} \quad (17)$$

$$CV_{PP\_HF}(T2) = \{8 \times (MP_{f\_HF}(T2) - MP_{r\_HF}(T2)) \times (R_H(T2) + X_H(T2)^2/R_H(T2))\}^{1/2} \quad (18)$$

The voltage controller 144 calculates $B_{DC}(T2)$ by using the calculation value $CV_{PP\_LF}(T2)$ and the calculation value $CV_{PP\_HF}(T2)$. The voltage controller 144 controls the DC power supply 104 of the voltage application unit DA3 such that the modulated DC voltage $B_{DC}$ has the voltage value $B_{DC}(T2)$ in the second period T2. Further, the voltage controller 144 may calculate the voltage value $B_{DC}(T2)$ by using the calculation value $CV_{PP\_LF}(T2)$, instead of the measurement value $MV_{PP\_LF}(T2)$, and by using the calculation value $CV_{PP\_HF}(T2)$, instead of the measurement value $MV_{PP\_HF}(T2)$, in any one of Equations (9) to (12).

In addition, in the present exemplary circuit configuration, the plasma impedance $ZP_L$ and the plasma impedance $ZP_H$ are obtained with reference to the table data. However, the matching controller 216 may calculate the plasma impedance $ZP_L$ by tracing the locus on the Smith chart with the current electrostatic capacitance of the condenser 112 and the current electrostatic capacitance of the condenser 114, and the matching controller 316 may calculate the plasma impedance $ZP_H$ by tracing the locus on the Smith chart with the current electrostatic capacitance of the condenser 120 and the current electrostatic capacitance of the condenser 124.

In addition, the matching controller 216 may obtain the impedance $Z_{100}(T1)$ of the first matcher 100 from the electrostatic capacitance of the condenser 112 and the electrostatic capacitance of the condenser 114 in the first period T1, and may obtain the plasma impedance $ZP_L(T1)$, by using the impedance $Z_{100}(T1)$ and the measurement value $MZ_{L\_LH}(T1)$ of the load impedance $Z_{L\_LH}$ in the first period T1. Further, the matching controller 216 may obtain the impedance $Z_{100}(T2)$ of the first matcher 100 from the electrostatic capacitance of the condenser 112 and the electrostatic capacitance of the condenser 114 in the second period T2, and may obtain the plasma impedance $ZP_L(T2)$, by using the impedance $Z_{100}(T2)$ and the measurement value $MZ_{L\_LH}(T2)$ of the load impedance $Z_{L\_LH}$ in the second period T2. In addition, the matching controller 316 may obtain the impedance $Z_{102}(T1)$ of the second matcher 102, from the electrostatic capacitance of the condenser 120 and the electrostatic capacitance of the condenser 124 in the first period T1, and may obtain the plasma impedance $ZP_H(T1)$ by using the impedance $Z_{102}(T1)$ and the measurement value $MZ_{L\_HF}(T1)$ of the load impedance $Z_{L\_HF}$ in the first period T1. Further, the matching controller 316 may obtain the impedance $Z_{102}(T2)$ of the second matcher 102 from the electrostatic capacitance of the condenser 120 and the electrostatic capacitance of the condenser 124 in the second period T2, and may obtain the plasma impedance $ZP_H(T2)$ by using the impedance $Z_{102}(T2)$ and the measurement value $MZ_{L\_HF}(T2)$ of the load impedance $Z_{L\_HF}$ in the second period T2.

Ninth Example of Matching Unit and Voltage Application Unit

Figure 16:
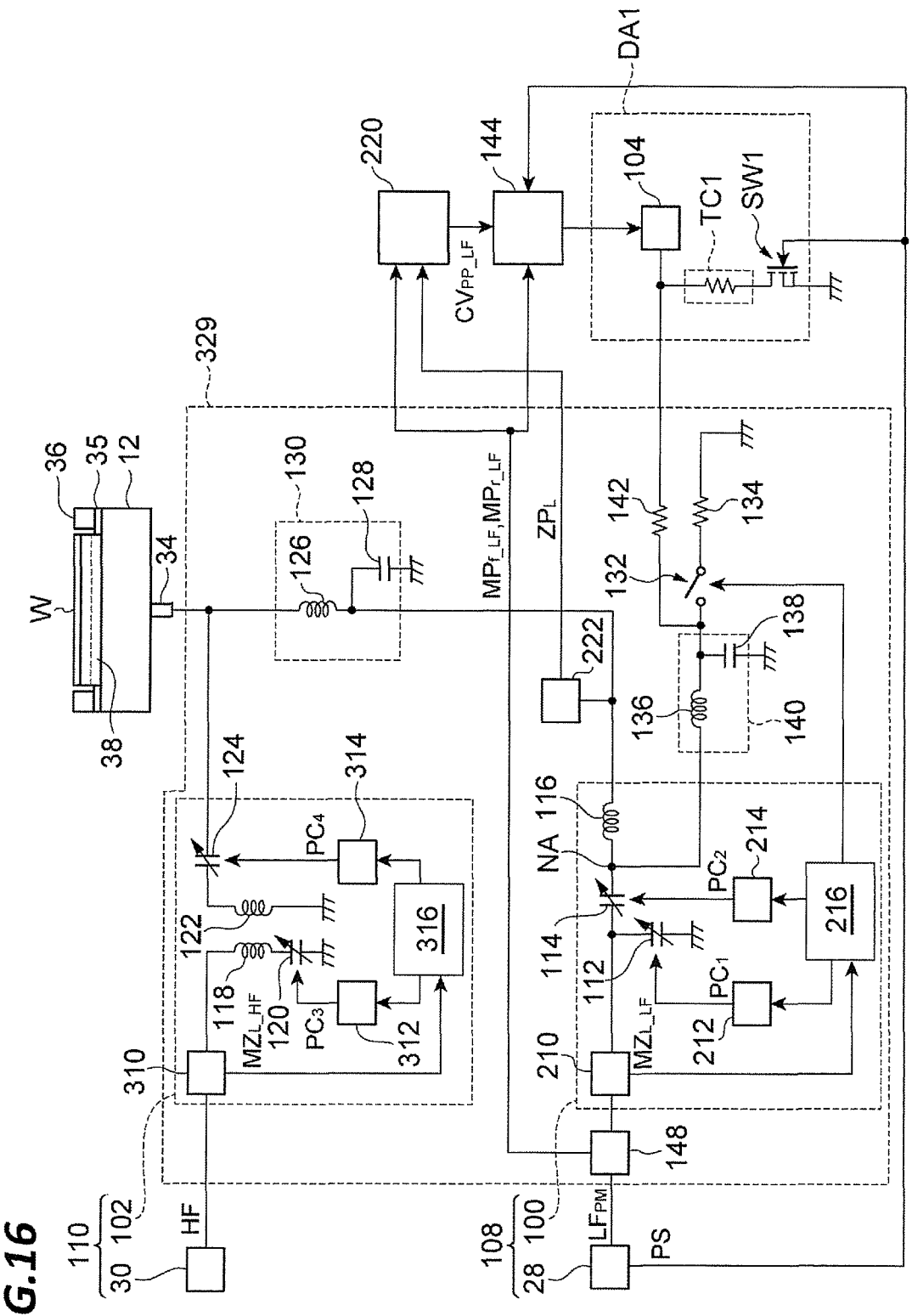
FIG. 16 is a view illustrating a ninth exemplary circuit configuration of the matching unit and the voltage application unit.

FIG. 16 is a view illustrating a ninth exemplary circuit configuration of the matching unit and the voltage application unit. The ninth exemplary circuit configuration is a modification of the seventh exemplary circuit configuration. In the ninth exemplary circuit configuration, the potential calculation unit 220 calculates the voltage value $B_{DC}(T1)$ from the measured plasma impedance $ZP_L$.

Specifically, the matching unit 329 of the ninth exemplary circuit configuration is provided with an impedance sensor 222 at the rear stage of the first matcher 100 on the high frequency transmission path. The impedance sensor 222 outputs the measured plasma impedance $ZP_L$ to the potential calculation unit 220. The potential calculation unit 220 may calculate the calculation value $CV_{PP\_LF}(T1)$ by using the plasma impedance $ZP_L(T1)$ in the first period T1, as in the seventh exemplary circuit configuration.

Tenth Example of Matching Unit and Voltage Application Unit

Figure 17:
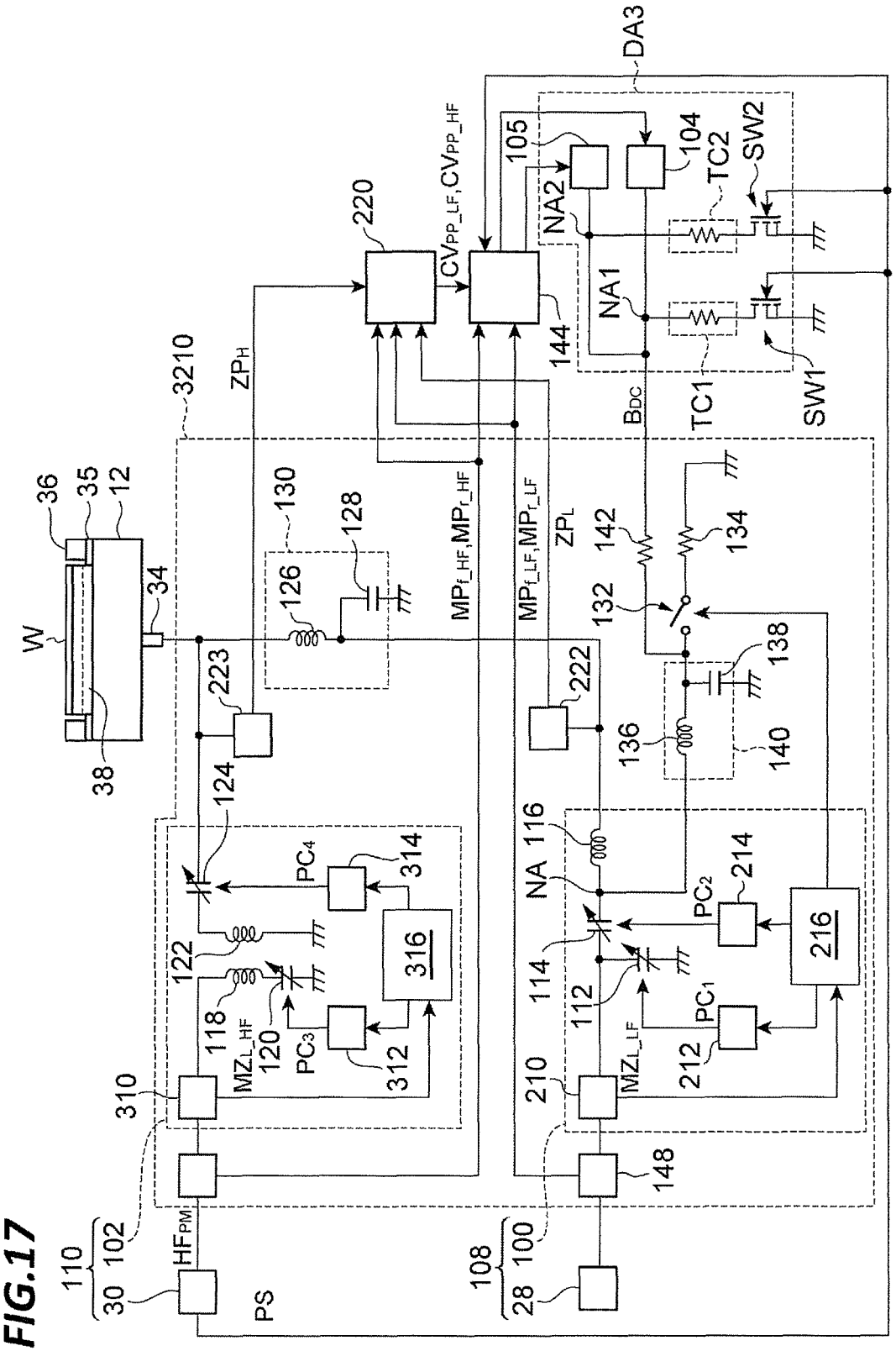
FIG. 17 is a view illustrating a tenth exemplary circuit configuration of the matching unit and the voltage application unit.

FIG. 17 is a view illustrating a tenth exemplary circuit configuration of the matching unit and the voltage application unit. The tenth exemplary circuit configuration is a modification of the eighth exemplary circuit configuration. In the tenth exemplary circuit configuration, the potential calculation unit 220 calculates the voltage value $B_{DC}(T1)$ and the voltage value $B_{DC}(T2)$ from the measured plasma impedance $ZP_L$ and the measured plasma impedance $ZP_H$.

Specifically, the matching unit 3210 of the tenth exemplary circuit configuration is provided with an impedance sensor 222 at the rear stage of the first matcher 100 on the high frequency transmission line, as in the ninth exemplary circuit configuration. Further, an impedance sensor 223 is provided at the rear stage of the second matcher 102 on the high frequency transmission line. The impedance sensor 223 outputs the measured plasma impedance $ZP_H$ to the potential calculation unit 220.

The potential calculation unit 220 may calculate the calculation value $CV_{PP\_LF}(T1)$ and the calculation value $CV_{PP\_HF}(T1)$ by using the measured plasma impedance $ZP_L(T1)$ in the first period T1 and the measured plasma impedance $ZP_H(T1)$ in the first period T1, as in the eighth exemplary circuit configuration. Further, the potential calculation unit 220 may calculate the calculation value $CV_{PP\_LF}(T2)$ and the calculation value $CV_{PP\_HF}(T2)$ by using the measured plasma impedance $ZP_L(T2)$ in the second period T2 and the measured plasma impedance $ZP_H(T2)$ in the second period T2, as in the eighth exemplary circuit configuration.

For example, the above-described voltage application unit DA1 and voltage application unit DA3 have the DC power supply that is unable to output the pulse modulated DC voltage. However, when the DC power supply that is able to output the pulse modulated DC voltage is employed, the switching device of the voltage application unit DA1 and the voltage application unit DA3 is not required. Further, the matching circuit of the first matcher 100 and the second matcher 102 is also not limited to the above-described matching circuit. For example, the first matcher 100 may adopt a T-shaped matching circuit, which is configured by two inductance-variable inductors and a capacitance-fixed condenser, as the matching circuit of the first matcher 100.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method for controlling a potential of a susceptor of a plasma processing apparatus that includes: a processing container; a susceptor formed of a conductor and provided within the processing container; an electrostatic chuck provided on the susceptor; a first radio frequency power supply configured to generate a first radio frequency wave for ion drawing-in; a second radio frequency power supply configured to generate a second radio frequency wave for plasma generation; a DC power supply configured to apply a positive polarity DC voltage to an electrode of the electrostatic chuck; and a voltage application unit configured to apply a voltage to the susceptor,
the method comprising:
supplying a pulse modulated radio frequency wave from at least one of the first radio frequency power supply and the second radio frequency power supply to the susceptor;
applying, by the DC power supply, a DC voltage, which is pulse-modulated in synchronization with the modulated radio frequency wave, from the voltage application unit to the susceptor, the modulated DC voltage having a voltage value set to reduce a difference between the potential of the substrate placed on the electrostatic chuck and the potential of the susceptor;
receiving, by the voltage application unit, a pulse signal which is synchronized with the modulated radio frequency wave, from at least one of the first radio frequency power supply and the second radio frequency power supply; and
applying, by the voltage application unit, a DC voltage which is modulated in synchronization with the pulse signal to the susceptor,
wherein the pulse signal has a first signal level in a first period when the modulated radio frequency wave has a first power, and the pulse signal has a second signal level in a second period when the modulated radio frequency wave has a second power smaller than the first power.

2. The method of claim 1, wherein, in the supplying the modulated radio frequency wave to the susceptor, the first radio frequency wave is pulse-modulated, and the modulated radio frequency wave is supplied to the susceptor, and
in the applying the modulated DC voltage to the susceptor, the voltage application unit applies the DC voltage to the susceptor in the first period, without applying the DC voltage to the susceptor in the second period.

3. The method of claim 2, wherein the voltage application unit applies a DC voltage having a voltage value, of which an absolute value becomes larger as a voltage amplitude on a transmission line, through which the modulated radio frequency wave is supplied to the susceptor, increases, to the susceptor in the first period.

4. The method of claim 2, wherein the voltage application unit applies a DC voltage having a voltage value in a data table, which is associated with the power of the first radio frequency wave, the power of the second radio frequency wave, and the modulated frequency of the modulated frequency wave, to the susceptor in the first period.

5. The method of claim 2, wherein the voltage application unit applies a DC voltage according to a measurement value of a self-bias potential of the substrate to the susceptor in the first period.

6. The method of claim 1, wherein, in the supplying the modulated radio frequency wave to the susceptor, the second radio frequency wave is pulse-modulated, and the modulated radio frequency wave is supplied to the susceptor, and
in the applying of the modulated DC voltage to the susceptor, the voltage application unit applies a first DC voltage having a first voltage value to the susceptor in the first period and a second DC voltage having a second voltage value, of which an absolute value is larger than an absolute value of the first voltage value, to the susceptor in the second period.

7. The method of claim 6, wherein the voltage application unit applies a DC voltage having a voltage value, of which an absolute value becomes larger as a voltage amplitude on a transmission line, through which the modulated radio frequency wave is supplied to the susceptor, to the susceptor in each of the first and second periods.

8. The method of claim 6, wherein the voltage application unit applies a DC voltage having a voltage value in a data table, which is associated with the power of the first radio frequency wave, the power of the second radio frequency wave, and the modulated frequency of the modulated frequency wave, to the susceptor in each of the first and second periods.

9. The method of claim 6, wherein the voltage application unit applies a DC voltage according to a measurement value of a self-bias potential of the substrate in each of the first and second periods.

* * * * *